United States Patent [19]
Abele et al.

[11] Patent Number: 5,475,355
[45] Date of Patent: Dec. 12, 1995

[54] METHOD AND APPARATUS FOR COMPENSATION OF FIELD DISTORTION IN A MAGNETIC STRUCTURE USING SPATIAL FILTER

[75] Inventors: Manlio G. Abele, New York; Henry Rusinek, Great Neck; Jens Jensen, Harrison, all of N.Y.

[73] Assignee: New York University, New York, N.Y.

[21] Appl. No.: 228,291

[22] Filed: Apr. 15, 1994

[51] Int. Cl.⁶ .............................. G01V 3/00; G03G 21/00
[52] U.S. Cl. ..................... 335/301; 324/320; 335/304; 335/306
[58] Field of Search ................... 335/302–306; 324/318–320

[56] References Cited

U.S. PATENT DOCUMENTS

| | | | |
|---|---|---|---|
| 5,028,903 | 7/1991 | Aubert | 335/306 |
| 5,107,239 | 4/1992 | Abele . | |
| 5,162,770 | 11/1992 | Abele . | |
| 5,216,401 | 6/1993 | Leupold | 335/306 |
| 5,382,905 | 1/1995 | Miyata et al. | 324/319 |
| 5,396,209 | 3/1995 | Leupold | 335/306 |

OTHER PUBLICATIONS

Optimum Design of Two–Dimensional Permanent Magnets, M. G. Abele, TR–21, NYU School of Medicine, New York, 1989.
Generation of a Uniform Field in a Yokeless Permanent Magnet for NMR Clinical Applications, M. G. Abele and H. Rusinek, TR–19, NYU School of Medicine, New York, 1988.
Effects of Demagnetization Characteristics in Two–Dimensional Permanent Magnets, M. G. Abele et al., TR–22, New York University, Jun. 1, 1990.
Field Computation in Permanent Magnets with Linear Characteristics of Magnetic Media and Ferromagnetic Materials, TR–24, New York University, Aug. 15, 1991.

*Primary Examiner*—Leo P. Picard
*Assistant Examiner*—Raymond Barrera
*Attorney, Agent, or Firm*—Rosen, Dainow & Jacobs

[57] ABSTRACT

A technique is provided for improving the homogeneity of the magnetic field within a cavity disposed inside a magnetic structure that has an opening to permit convenient access to an imaging region. The technique is based upon the step of inserting layers of magnetized material between plates of high magnetic permeability material. The layers are inserted at the boundary of the cavity. The technique includes the step of (1) computing the surface charges on the plates as used to derive the distribution of the magnetostatic potential, (2) analyzing the uniformity of the magnetic field within the imaging region as effected by the opening in the magnetic structure by expanding the magnetostatic potential in a spatial harmonic series, and (3) determining the geometry and the composition of the inserted layers based on the successive elimination of increasing orders of spatial harmonics in the potential expansion within the imaging region. This invention also includes the structure resulting from carrying out the technique of the invention.

24 Claims, 17 Drawing Sheets

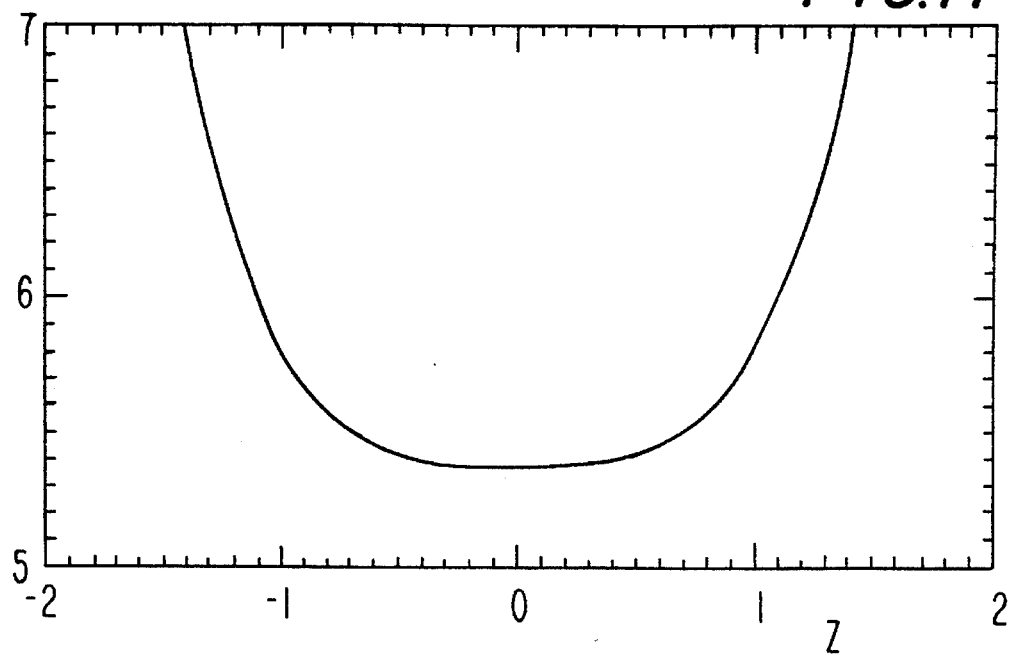

FIG.19
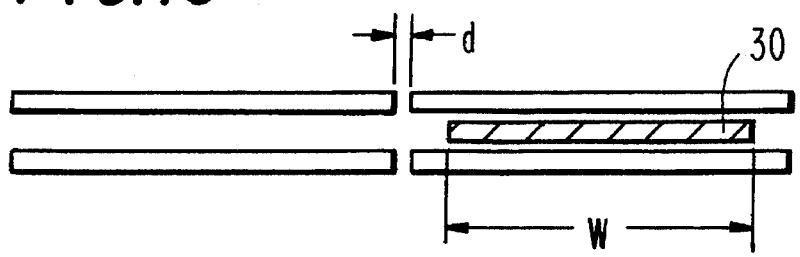
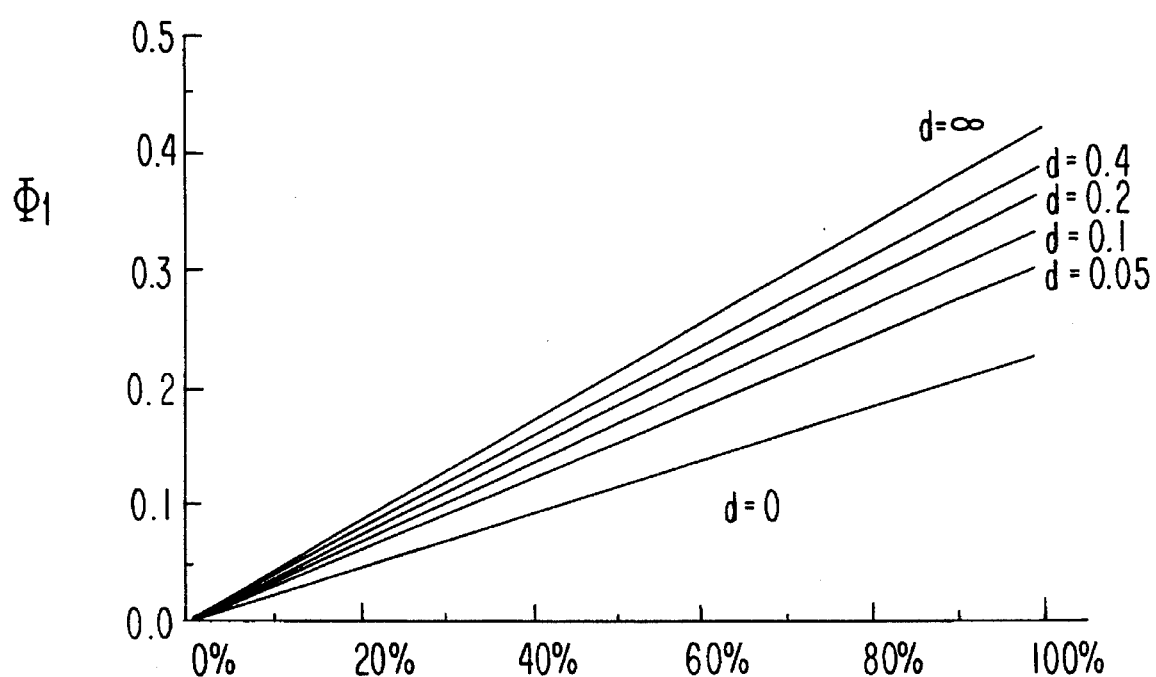
FIG.20

METHOD AND APPARATUS FOR COMPENSATION OF FIELD DISTORTION IN A MAGNETIC STRUCTURE USING SPATIAL FILTER

RELATED REPORTS AND APPLICATIONS

Technical reports "Generation of a Uniform Field in a Yokeless Permanent Magnet for NMR Clinical Applications", M. G. Abele and H. Rusinek, TR-19, NYU School of Medicine, New York, 1988 and "Optimum Design of Two-Dimensional Permanent Magnets", M. G. Abele, TR-21, NYU School of Medicine, New York, 1989; Technical Reports "Effects of Demagnetization Characteristics in two dimensional permanent magnets", M. G. Abele, H. Rusinek, TR-22, New York University, Jun. 1, 1990; "Field Computation in Permanent Magnets with Linear Characteristics of Magnetic Media and Ferromagnetic Materials", TR-24, New York University, Aug. 15, 1991; U.S. patent applications Ser. No. 424,162, M. G. Abele, filed Oct. 19, 1989; Ser. No. 909,143, Abele et al., filed Jul. 6, 1992 (Case NYU130); Ser. No. 08/007,523 filed Jan. 22, 1993, entitled "Method and apparatus for Compensation of Distortion in a Magnetic Structure" (attorney docket NYU-138); and U.S. Pat. Nos. 5,107,239, Abele and 5,162,771, Abele. The contents of each of the above reports, patent applications and patents is incorporated herein by reference.

FIELD OF THE INVENTION

This invention relates to an apparatus and method for the compensation of distortion of the field of a magnetic structure, and more particularly to a magnetic structure employing means and method for compensating for such field distortion, imaging (MRI) and similar applications, one must determine the geometry and distribution of magnetization to generate a substantially uniform field within a region of interest, i.e.,imaging region, within a cavity within the structure. A nearly perfect solution for generating a perfectly uniform field is possible only if the magnetic structure completely encloses the volume of interest. See M. G. Abele, *Structures of Permanent Magnets* (Wiley, New York 1993), the contents of which are incorporated herein by reference.

In practical imaging applications, several factors contribute to the perturbation of the field inside the cavity. The most significant cause for field distortion is the opening of the magnet to access the cavity for human entry. For instance, ideal two-dimensional structures must be truncated at both ends. Permanent magnets used for MRI require a substantially uniform field within the imaging region. Therefore, field distortion must be compensated for.

There are several approaches to compensate for the effects of the magnet opening. In a traditional magnet the generation of the desired field characteristics, and in particular the desired uniformity is accomplished by the design of the ferromagnetic pole pieces, which are high magnetic permeability structures inserted within the cavity. The imaging region is contained within the gap or cavity between the pole pieces whose shape is usually the most important part of the overall magnet design. A magnet design having the pole pieces with lengths of at least two times the distance between the pole pieces improves the uniformity within the imaging region because the distortion radiating from the edges of the opening have less of an effect on the imaging region. Increasing the length of the pole pieces however means increasing the total size of the magnet structure. This is disadvantageous for two reasons. First, an increase in size is a problem when space is limited. Second, the size of the magnet determines its weight. Consequently, additional structure may be necessary to support the magnet.

Another approach for compensating for field distortion is provided by the applicant in U.S. patent application Ser. No. 08/007,523 described above. In this application, field distortion is compensated by a magnetized structure which has a soft or passive magnetized element provided in a slit that is formed from two spaced apart magnetized elements having surfaces in a common plane that defines a wall of a cavity.

OBJECTS AND SUMMARY OF THE INVENTION

It is an object of the present invention to provide a permanent magnetic structure for MRI and similar applications that will provide optimal field requirements within an imaging region and geometrical requirements dictated by the dimensions of a human body.

Another object of the present invention is to provide a magnetic structure for MRI that will enable convenient access to the imaging region over a wide range of orientations of the human body.

Another object of the present invention is to provide a magnetic structure for MRI that will have reduced size and weight.

The above objects are achieved in accordance with the invention by a technique for improving the homogeneity of the magnetic field within a cavity disposed inside an magnetic structure that has an opening to permit convenient access to an imaging region. The technique is based upon the step of inserting layers of magnetized material between plates of high magnetic permeability material. The layers are preferably inserted at the boundary of the cavity. The technique includes the step of (1) computing the surface charges on the plates as used to derive the distribution of the magnetostatic potential, (2) analyzing the uniformity of the magnetic field within the imaging region as effected by the opening in the magnetic structure by expanding the magnetostatic potential in a spatial harmonic series, and (3) determining the geometry and the composition of the inserted layers based on the successive elimination of increasing orders of spatial harmonics in the potential expansion within the imaging region. This invention also includes the structure resulting from carrying out the technique of the invention.

In accordance with the present invention, an apparatus for nuclear magnetic resonance scanning and imaging (MRI) is provided having a magnetic structure. The magnetic structure comprises first and second spaced apart magnetic elements. The first and second magnetic elements have surfaces which interface with and define a cavity. The imaging region generally is encompassed within said cavity which has an opening exposing the cavity to receive a body part(s). The structure also comprises means for producing a magnetic field within said cavity. The magnetic field has undesirable harmonics in the imaging region as a result of said opening. The magnetic structure also comprises means for reducing undesirable harmonics in said first region including means for controlling the magnetostatic potential of a surface of said first and second magnetic elements interfacing with said cavity but outside said imaging region.

In accordance with another aspect of the present invention, an apparatus for nuclear magnetic resonance scanning and imaging (MRI) is provided having a magnetic structure. The magnetic structure comprises a cavity disposed therein and an opening exposing said cavity to receive a body part. The structure also comprises first and second spaced apart magnetic elements having surfaces which define a portion of said cavity, and means for producing a magnetic field within said cavity. The opening causes the field to distort. The magnetic structure further comprises means for compensating for said field distortion. The compensating means includes a third magnetic element disposed adjacent said first magnetic element and having at a surface interfacing with said cavity a magnetostatic potential different from said magnetostatic potential of said first magnetic element.

In accordance with the present invention, a method for compensating for field distortion in a magnetic structure for MRI is provided including first and second magnetic elements which interface with and define a portion of an open cavity disposed therein. The method comprises the steps of generating a magnetic field within said cavity, said open cavity resulting in field distortions in a first imaging region within the cavity, computing the field on a surface of a second region which encompasses said first imaging region, and reducing the distortion within said first imaging region including the step of controlling the magnetostatic potential of the surfaces of the magnetic elements which interface with the cavity but which lie outside said first imaging region.

The above and other objects, aspects, features and advantages of the invention will be more readily apparent from the description of the preferred embodiment thereof taken in conjunction with the accompanying drawings and appended claims.

BRIEF DESCRIPTION OF THE DRAWINGS

The invention is illustrated by way of example and not limitation in the figures of the accompanying drawings in which like references denote like or corresponding parts, and in which:

FIG. 1(a) is a cross sectional view of the ferromagnetic elements shown in FIG. 1 taken along line 1A—1A;

FIG. 11 is a graph of the relative distortion of the magnetic field component $H_y$ versus the z' axis as a result of the opening shown in FIG. 7;

FIG. 12 is a graph of the field along the x' axis within the closed magnet for a 1 degree tilting of the ferromagnetic plates (shown in FIG. 5);

FIG. 19 illustrates a side cross sectional view of two adjacent filter plates with a mirror image of the main ferromagnetic plate shown in FIG. 18;

FIG. 20 is a graph of the magnetostatic potential generated by each filter plate and the main plate structure shown in FIG. 17 versus the amount of filling inserted between these elements for different values of the distance between individual ferromagnetic plates;

DESCRIPTION OF THE PREFERRED EMBODIMENT

The following description presents the technique or conceptual design of a permanent magnet for NMR imaging for a limited region of the human body according a preferred embodiment of the present invention. The analysis presented in each of the following sections is intended to provide guidelines and the design approach of a magnet structure that optimizes the field requirements within the selected imaging region and the geometrical requirements dictated by the dimensions of a human body.

The field intensity chosen for the magnet structure described below is based upon 0.2 Tesla (0.2 T). The dimensions of the imaging region are of the order of 20 cm and the dimensions of the magnetic structure are also kept small to provide a minimum interference with the patient's body. The cavity disposed within the magnetic structure is roughly 90 cm in length and 35 cm in height. However any required field intensity and size of the imaging region and cavity can be used provided such design choice conforms to the geometrical and physical characteristics of the particular magnet.

In the preferred embodiment, the magnetic structure has an opening in two adjacent sides of the cavity to enable convenient access to the imaging region over a wide range of orientations of the human body. The magnet is intended for use in MRI for a localized field of view, such as imaging of shoulders, hips, breast, head and neck. In other embodiments however, the magnetic structure can have many openings. This will also be described below.

In the preferred embodiment, a hybrid structure is selected for the basic magnetic structure because it exhibits a better figure of merit compared to the categories of yoked and yokeless magnets. See M. G. Abele, *Structures of Permanent Magnets*(Wiley, New York 1993).

The key aspect of the design is a magnetic structure that compensates for the field distortion caused by the magnet opening. A novel technique to achieve the compensation is designed to be integrated in the fabrication of the magnet. Furthermore, the same technique is used in the implementation of the logic for the compensation of the fabrication tolerances in the shimming of the assembled magnet. Such a technique is described below.

The technique is best understood by a description of a conventional magnet geometry. Therefore, the first section describes a basic magnet geometry. The second section describes the effects of an opening in the conventional magnet. The third section describes the basic design of the filter plates, i.e., the magnetic elements used to compensate for the distortion created by the opening in the magnet. The fourth section discusses design considerations and the fifth section makes a concluding description on the importance of fabrication, assembly and tuning of the magnet.

1. Basic Magnet Geometry

Figure 2:
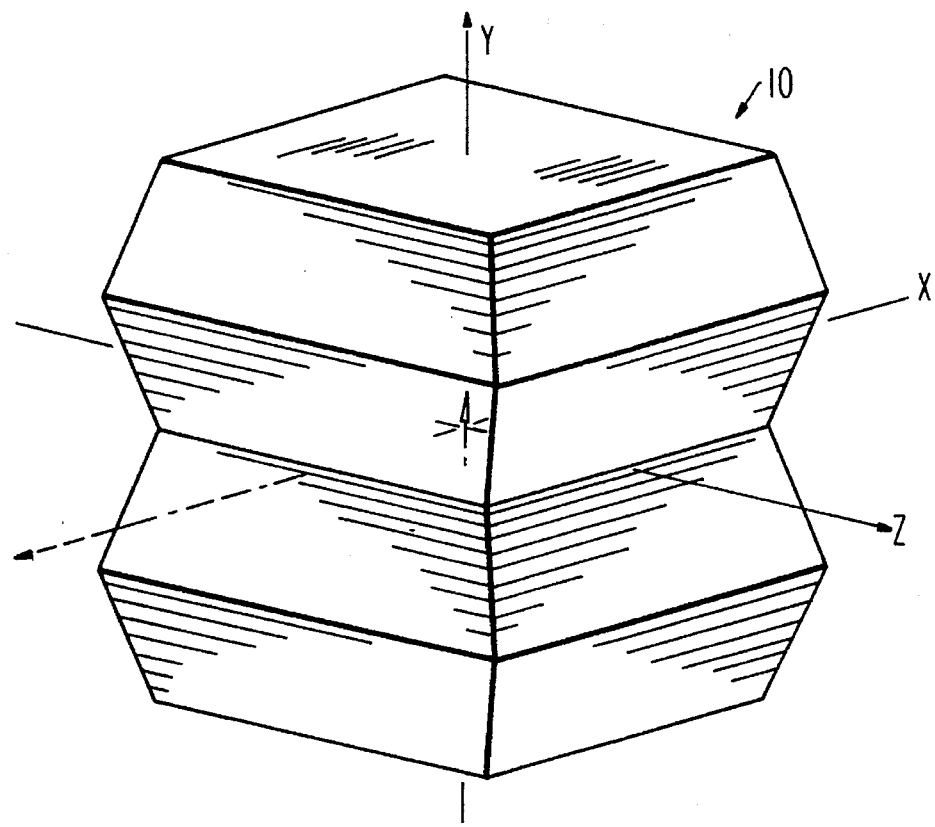
FIG. 2 is a side perspective view of a conventional magnetic structure having its magnetic field oriented along the Y axis.
Figure 3:
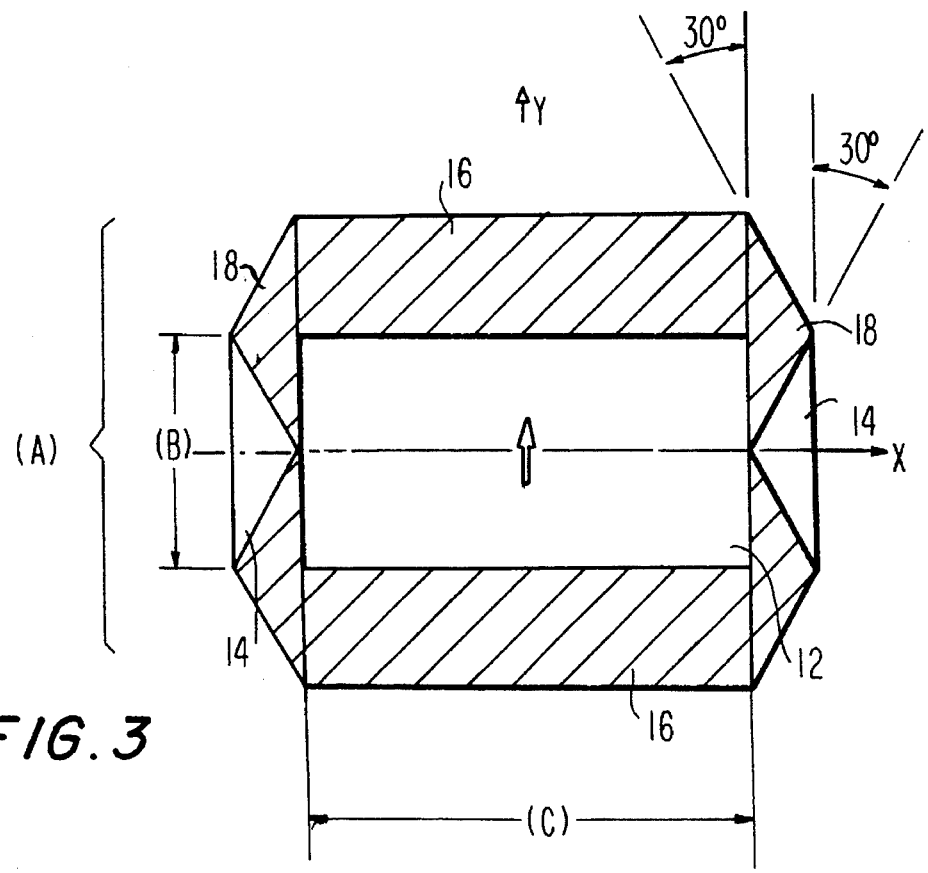
FIG. 3 is a cross sectional view of the structure shown in FIG. 2 taken along the X-Y plane, showing a rectangular prismatic cavity disposed within the structure.

Referring to FIGS. 2 and 3, the basic structure of the magnet is derived from a closed hybrid structure 10 designed around a rectangular prismatic cavity 12 of dimensions $2x_0, 2y_0, 2z_0$ with the magnetic field oriented along the y axis. The geometry of the magnetic structure is shown in FIG. 2 and the cross-section of the magnet in the z=0 plane is shown in FIG. 3. The rectangular components 16 and triangular components 18 of the magnetic structure are made of permanent magnetic material. Such magnetic material is conventionally referred to as hard magnetic material. The external line 14 in FIG. 3 represents a ferromagnetic yoke that encloses the magnetic structure 10. The ferromagnetic material is conventionally referred to as soft magnetic material.

The geometry of the hybrid structure 10 of FIG. 2 depends upon the parameter $$K = \mu_0 \frac{H_0}{J_0}, \quad (1.1)$$

where $H_0$ is the intensity of the field within the cavity 12 and $J_0$ is the magnitude of the remanence of the magnetic material. The remanence $J_0$ is assumed to be the same for all components of the structure. The remanence of the rectangular components 16 of the magnetic structure of FIG. 3 is oriented along the y axis and the remanence of the triangular components 18 is perpendicular to their external boundaries. The intensity of the magnetic field in the rectangular components 16 is $$H = -\frac{1}{\mu_0}(1-K)J \quad (1.2)$$

and the intensity of the magnetic field in the triangular components 18 is $$H = -\frac{J}{\mu_0}, \quad (1.3)$$

Hence no flux of the magnetic induction is generated in the triangular components 18 and the field vanishes in the region between the yoke 14 and the triangular components 18. As a consequence, the geometry of the yoke 14 can be chosen arbitrarily and adapted to satisfy structural requirements and fabrication constraints.

The figure of merit M of a permanent magnet is defined as $$M = K^2 \frac{V_c}{V_m}, \quad (1.4)$$

where $V_c$ and $v_m$ are the volumes of the cavity 12 and the magnetic material respectively. The hybrid structure of FIG. 2 has been chosen because its figure of merit is higher than the figure of either yokeless or yoked structures.

The figure of merit of the hybrid structure shown in FIG. 3 for the particular case $x_0=z_0$ is $$M = K(1-K)\left\{1 + \frac{y_0}{x_0}\frac{1}{\sqrt{(1-K)^3(1+K)} + \sqrt{K^3(2-K)}}\left[1 + \frac{K}{3}\frac{y_0}{x_0}\frac{1}{\sqrt{(1-K)^3(1+K)} + \sqrt{K^3(2-K)}}\right]\right\}^{-1} \quad (1.5)$$

For $x_0$ sufficiently large compared to $y_0$ the optimum value of the figure of merit is achieved at approximately $$K = 0.5 \quad (1.6)$$

and it is equal to $$M \approx 0.153, \quad (1.7)$$

Figure 4:
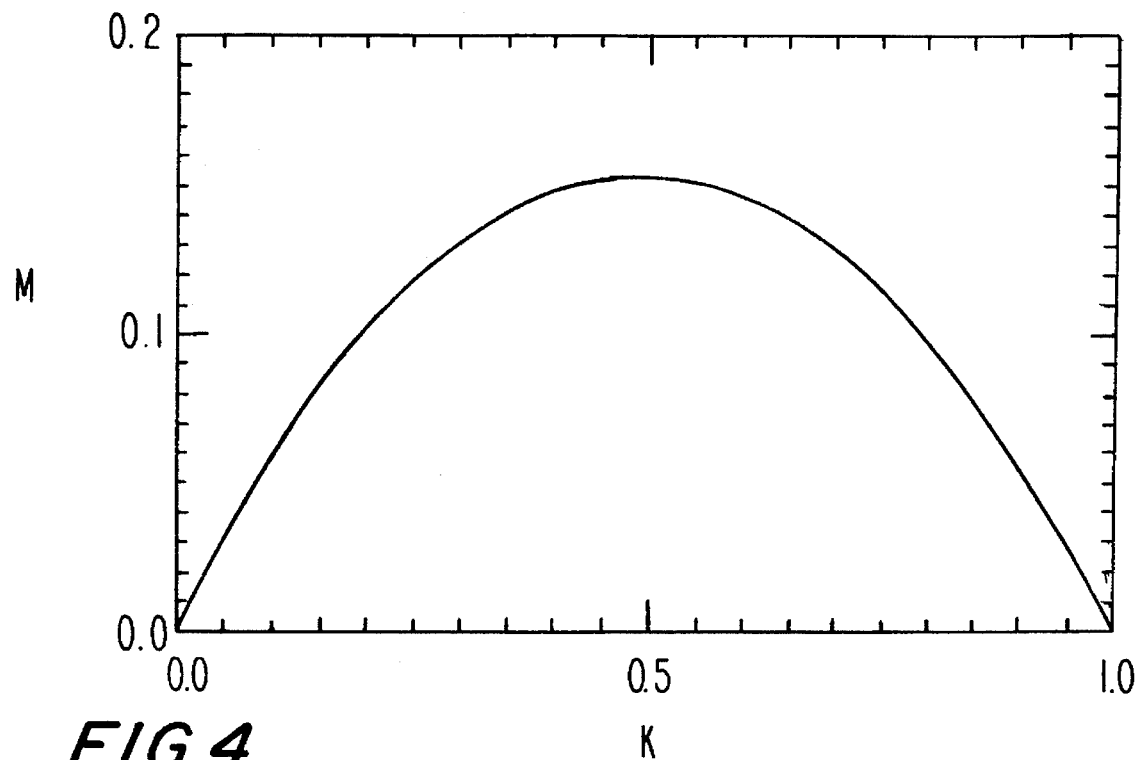
FIG. 4 is a graph of the value of the figure of merit (M) versus the parameter K for the magnetic structure shown in FIG. 2 having a value of $$\frac{y_0}{x_0} = 0.5, x_0 = z_0 \tag{1.8}$$

The absolute maximum value of M is M=0.25 and is achieved in the limit $y_0/x_0 \to \infty$ The ratio $$\frac{y_0}{x_0} = 0.5, x_0 = z_0 \quad (1.8)$$

selected for this magnet is a compromise between a sufficiently high value of M and practical dimensions of the magnet. FIG. 4 shows the value of M versus K for a three-dimensional hybrid magnet $(x_0=z_0=2y_0)$ designed around a cavity given by Eq. 1.8.

The magnet is designed to generate a field $$\mu_0 H_0 \approx 0.2 T, \quad (1.9)$$

which is achieved at the optimum value of M given by Eq. 1.4 with a ferrite material of a nominal remanence $$J_0 \approx 0.4 T, \quad (1.10)$$

The dimensions of the components of the magnetic structure shown in FIG. 3 for the value of K is given by Eq. 1.4. In FIG. 3, the dimension of length (A) is 4 meters, (B) is 2 meters and (C) is 4 meters.

Figure 5:
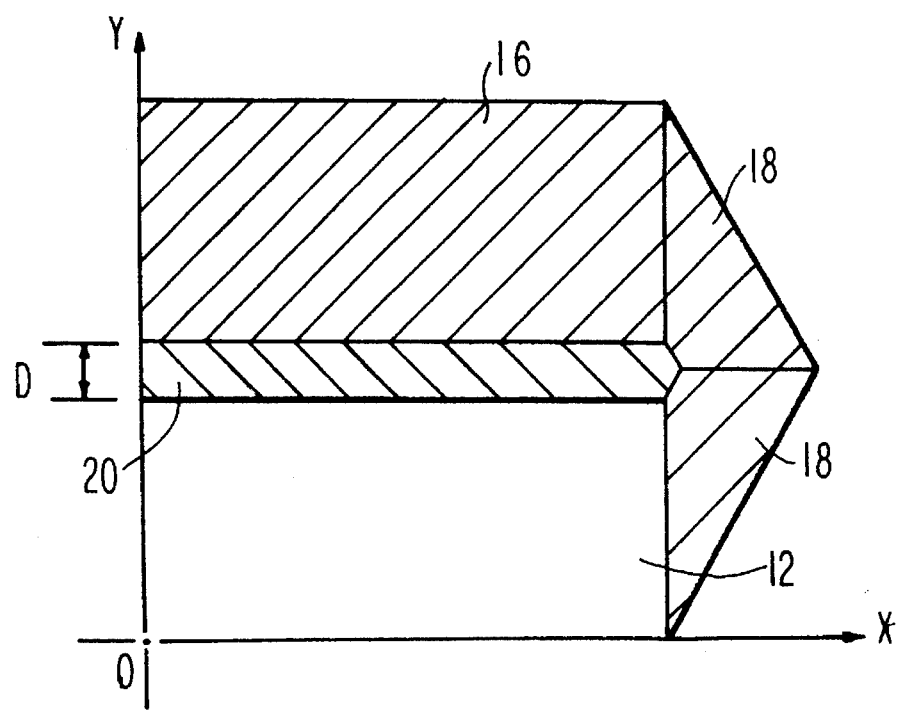
FIG. 5 is a cross sectional view of the magnetic structure shown in FIG. 2 having high magnetic permeability placed along the surface of the cavity.

The field generated by the magnetic structure 10 is not altered if the region contained within an equipotential surface is replaced by a soft magnetic material of high magnetic permeability. The soft magnetic material is shown in FIG. 5 as a ferromagnetic plate 20. It is understood that generally all ferromagnetic materials have a high magnetic permeability. High magnetic permeability as used herein refers to values of 100 $\mu_{air}$ (100 times the permeability of air). The insertion of the $\mu=\infty$ material results in a reduction of the volume of the cavity 12 and of the permanent magnetic material. However, in relative terms, the permanent magnetic material is reduced by a smaller amount compared to the reduction of the cavity volume. As a consequence, the insertion of the soft $\mu=\infty$ material results in a lower figure of merit. Thus the thickness of the $\mu=\infty$ soft ferromagnetic plates 20 shown in FIG. 5 will be kept to the minimum compatible with their mechanical rigidity and the requirements of the tuning technique, as described in Section 3 below. Note that only one plate 20 is shown in FIG. 5. However a second ferromagnetic plate is also located below the X-Z plane along the opposing parallel surface of the cavity 12. The thickness (D) of the plate 20 shown in FIG. 5 is $2y_p$.

The field generated by the magnetic structure of FIG. 3 is uniform as long as the magnetic material exhibits a linear demagnetization characteristic with zero magnetic susceptibility. Within the operating range of the material of the rectangular components of the structure, the susceptibility $\chi_m$ is of the order $$\chi_m \approx 0.03. \quad (1.11)$$

Thus the effect of the non-zero value of $\chi_m$ can be computed as a perturbation of the exact solution obtained for $\chi_m=0$ [2] See technical report TR-22 described above. This is done by computing the field generated by a distribution of remanence $$\delta J = \mu_0 \chi_m H(0), \quad (1.12)$$

where H(0) is the intensity of the field generated in the limit $\chi_m=0$.

Figure 6:
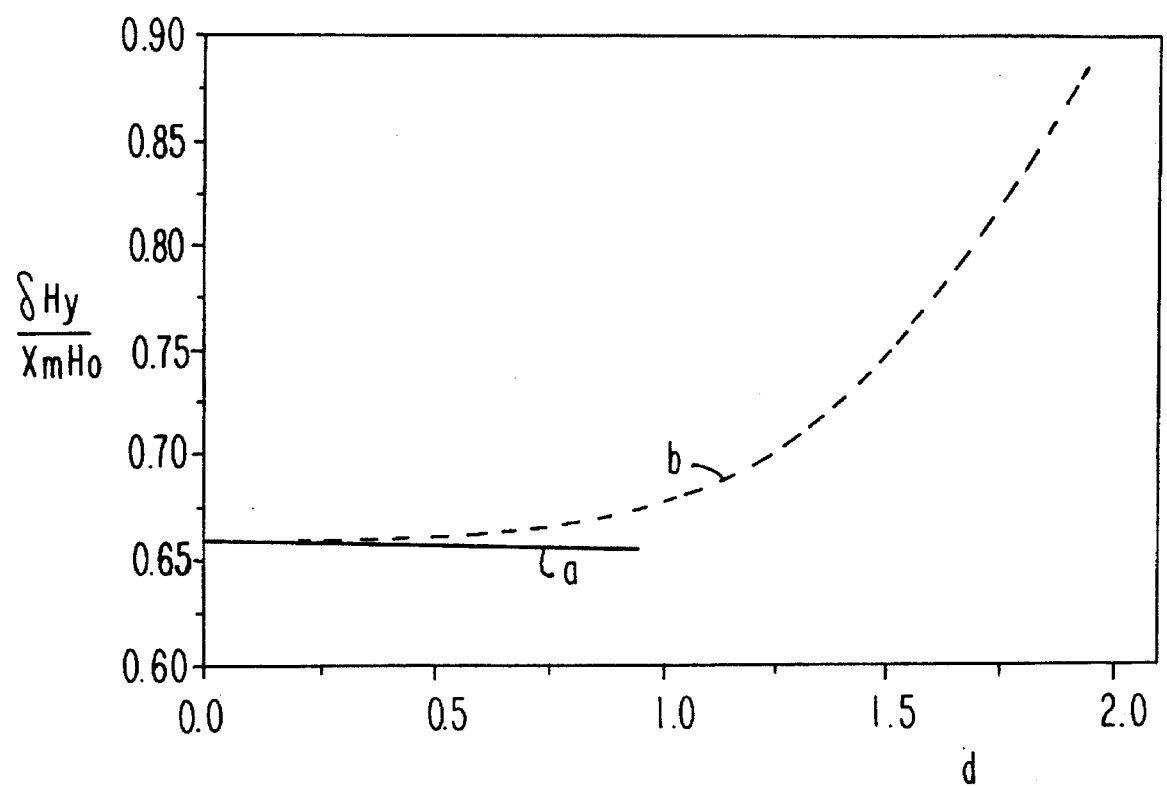
FIG. 6 is a graph of the value of the field perturbation H induced by a change in the remanence along the Y axis and on the line x=z, y=0.

Assuming the cavity dimensions given by Eq. 1.8, FIG. 6 shows the value of the field perturbation H induced by $\delta J$ $\chi_m \neq 0$ on the y axis (line (a)) and on the line x=z, y=0 (line (b)). The field at the center of the cavity is reduced by $$\frac{\delta H_{x=y=z=0}}{H_0} \approx 0.66 \chi_m, \quad (1.13)$$

Thus the value $\chi_m=0.03$ results in about 2% reduction of the field at the center.

In conclusion, geometry, dimensions, material and field intensity of the closed magnet are selected on the basis of the following criteria:

1. Adoption of an hybrid structure that eliminates the fringe flux of the magnetic induction outside the magnet cavity, thereby resulting in the most efficient use of the magnetic material.
2. Optimization of the figure of merit by selecting a value of the magnetic induction equal to half the value of the remanence.
3. Selection of a 0.2 T field intensity for the example given, which suggests the use of ferrite material.
4. Adoption of a rectangular prismatic cavity which achieves the optimum condition of alignment of field and magnetization throughout the magnetic structure.
5. Development of a design which minimizes the number of machining and assembly operations of the components of the magnetic structure.

2. Opening of the Magnet

Figure 7:
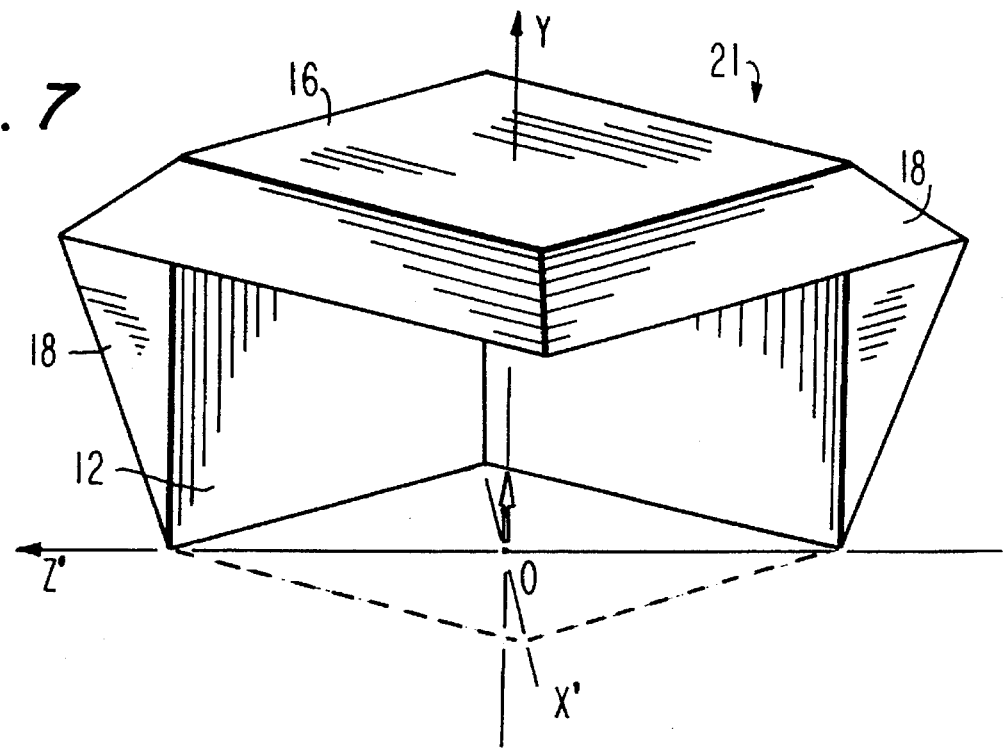
FIG. 7 illustrates the magnetic structure shown in FIG. 2 in the region of y>0 showing two open adjacent sides.

The magnet design begins with the closed geometry of FIG. 2 with the cavity 12 dimension given by Eq. 1.8 and the value of $\kappa$ given by Eq. 1.6. To be consistent with the geometrical symmetry of the open magnet, a frame of rectangular coordinates x', y, z' is chosen where axis x', z' are rotated by $\pi/4$ with respect to axes x and z, as indicated in FIG. 7. The magnetic structure is opened by removing at two sides both the permanent magnetic portions and the external yoke in the region $$x'<0, -y_0 \leq y \leq +y_0 \quad (2.1)$$

Thus in the region y>0 the magnetic structure reduces to that shown in FIG. 7. As described above, note the two adjacent side openings. Also note that the structure below the y<0 plane is not shown. However, it is the mirror image of that shown for y>0.

Figure 8:
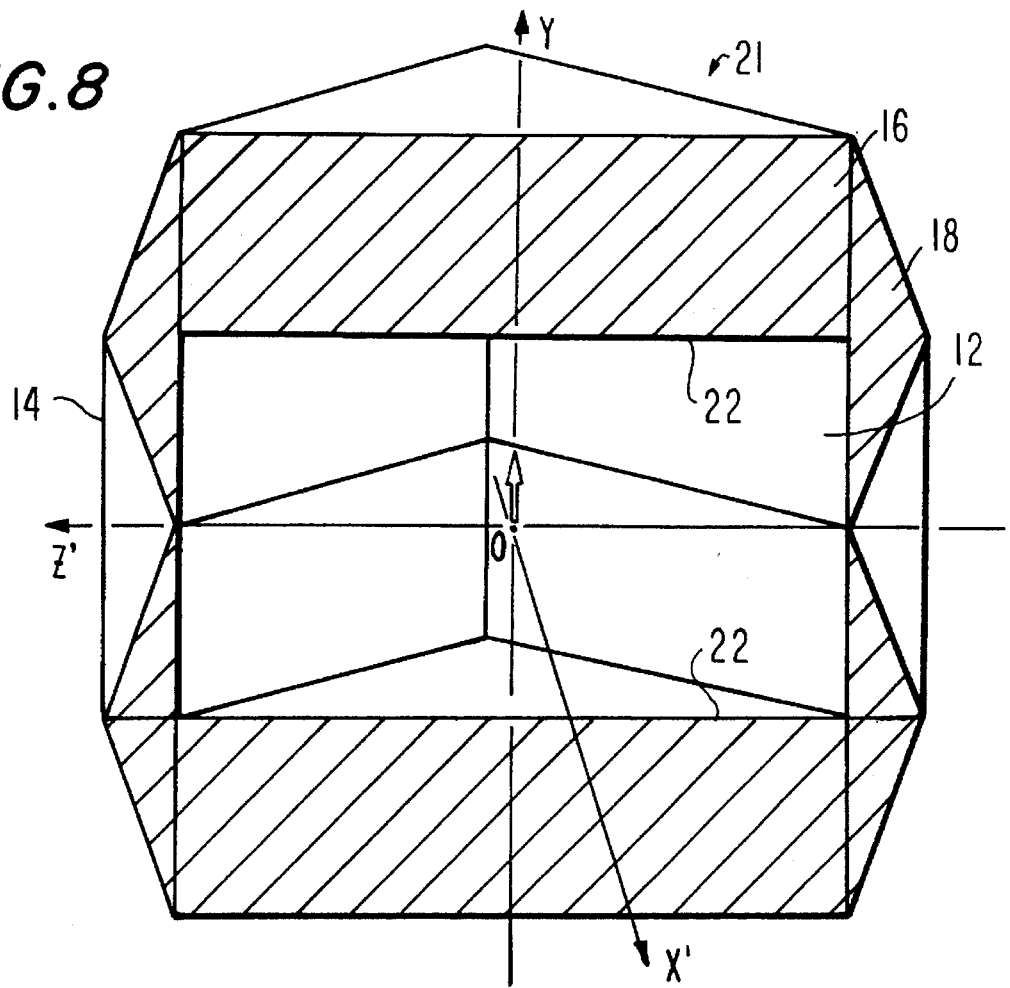
FIG. 8 is a cross sectional view of magnetic structure shown in FIG. 7 taken along the plane of Z'-Y when x'=0 for K=5.

FIG. 8 shows the cross section of the complete magnet in the plane x'=0. The line enclosing the magnetic structure shown in FIG. 8 represents the external yoke 14 and the lines at $y=\pm y_0$ represents the high permeability ferromagnetic plates 22 located at the interface between cavity 12 and hard permanent magnetic material of rectangular component 16. The following calculation of the field in the open magnet 21 are conducted assuming $\chi_m = 0$ and an infinite permeability of the material of the ferromagnetic plates 22. Furthermore, both yoke 14 and plates 22 are assumed to have zero thickness.

Figure 9:
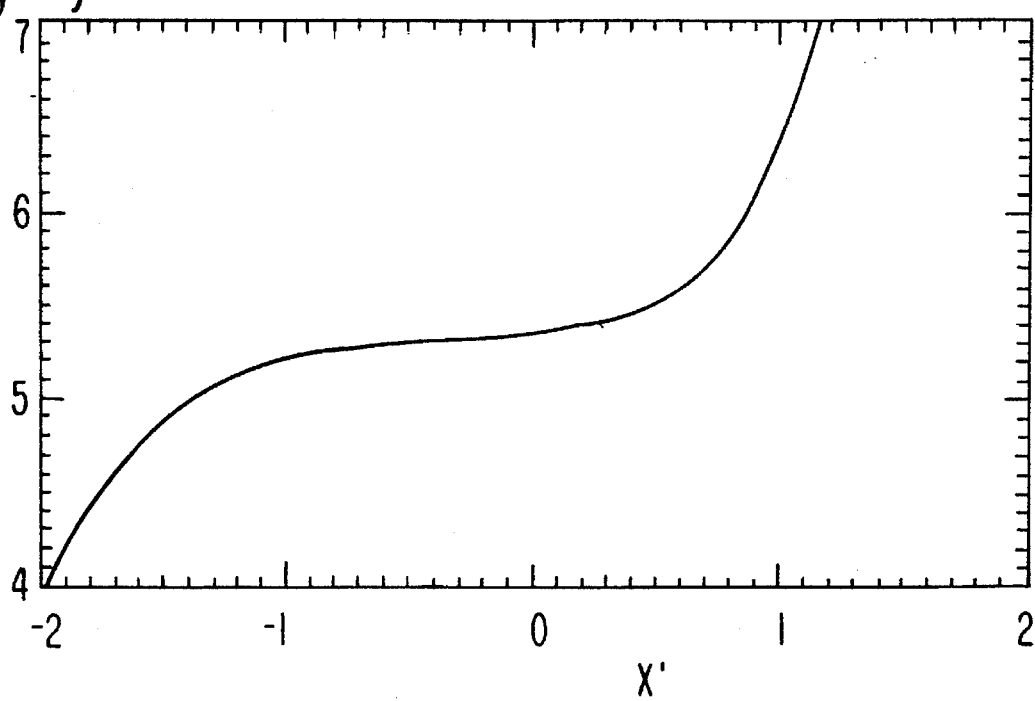
FIG. 9 is a graph of the relative distortion of the magnetic field component $H_y$ versus the x' axis as a result of the opening shown in FIG. 7.

The distribution of the magnetic field is computed using a formulation of the boundary elements method. See technical report TR-24 described above. The results are presented in FIGS. 9, 10, and 11. FIG. 9 shows the relative distortion of the component $H_y$ of the intensity versus x' in the y=0 plane. The non-symmetric opening of the magnet 21 generates a gradient of the field at x'=0 and, as expected, the inflection point is found at a negative value of x'.

Figure 10:
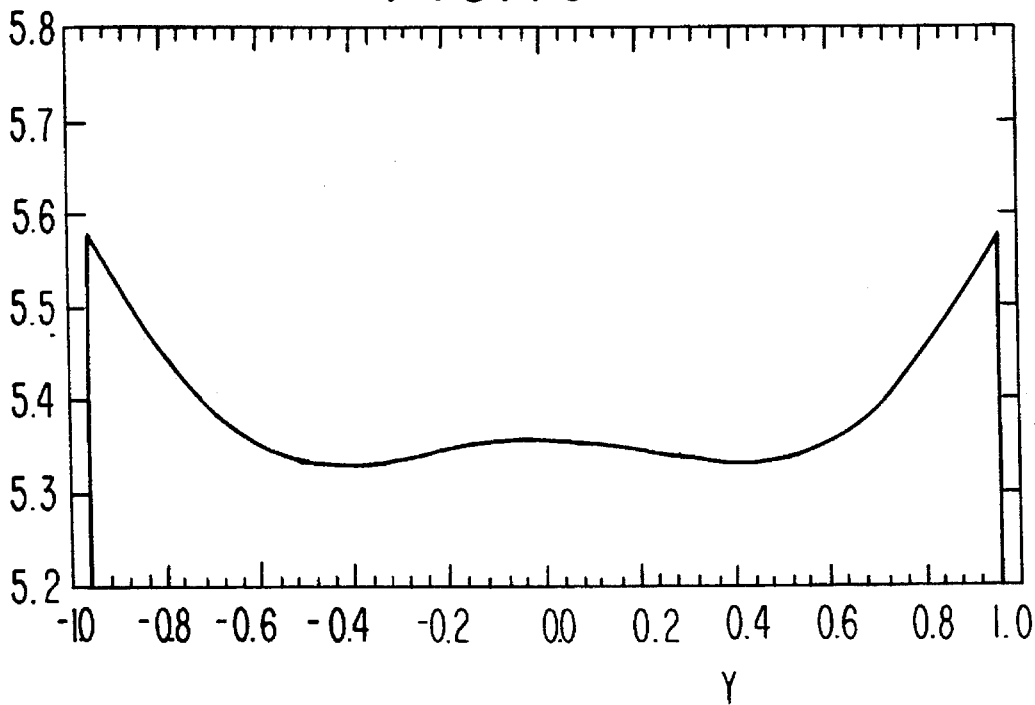
FIG. 10 is a graph of the relative distortion of the magnetic field component $H_y$ versus the y axis as a result of the opening shown in FIG. 7.

FIGS. 10 and 11 show the distortion of $H_y$ along axes y, z'. Because of symmetry, the distortion is symmetric with respect to the y=0, z'=0 planes.

In order to shift the center of the imaging region in the positive direction x', a correction of the gradient has to be made. This can be achieved in several ways that include electric currents and a modification of either the distribution of magnetized material or the geometry of the cavity. In the preferred method, the simplest modification of the geometry is a tilting of the $\mu=\infty$ plates in the direction of x' so that the distance between the plates decreases as x' increases. The effect of the tilting is illustrated in FIG. 12. FIG. 12 shows the component $H_y$ on the x' axis for the closed magnetic structure assuming a 1° tilting. The linearity of the variation of $H_y$ about the center is maintained within $5.10^{-3}$ in the range $-0.5 < x'/y_0 < 0.5$.

Figure 13:
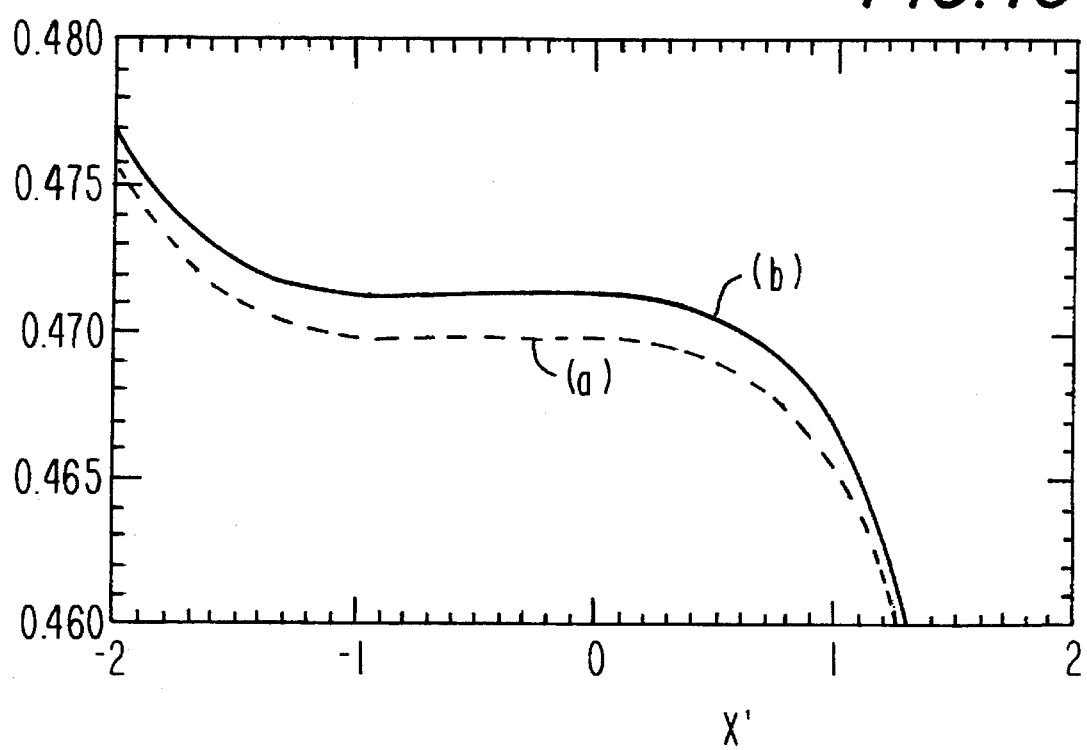
FIG. 13 is a graph of the magnetic field along the x' axis within the open magnet for a 0.2 degree tilting of the ferromagnetic plates (line a) and two 0.2 degree wedges (line b)

The effect of the tilting in the open magnet is illustrated in FIGS. 13–16. Curve (a) in FIG. 13 shows the component $H_y$ on the x' axis for a 0.2° tilting. The gradient generated by the tilting reduces the variation of $H_y$ to approximately $4.10^{-4}$ within an interval $\delta x'=1.4$ centered at $x'=-0.5$.

Another way of achieving the field gradient is the addition of two $\mu=\infty$ plates tilted in the direction of x' within the cavity. The two new plates are in contact with the plates located at $y=\pm y_0$. Thus this new arrangement corresponds to the insertion of two $\mu=\infty$ wedges in contact with the magnetized material. The effect of a 0.2° wedge is shown by curve (b) in FIG. 13. One observes that plots (a) and (b) are essentially parallel to each other, with the wedge exhibiting the higher value of the field within the cavity.

Figure 14:
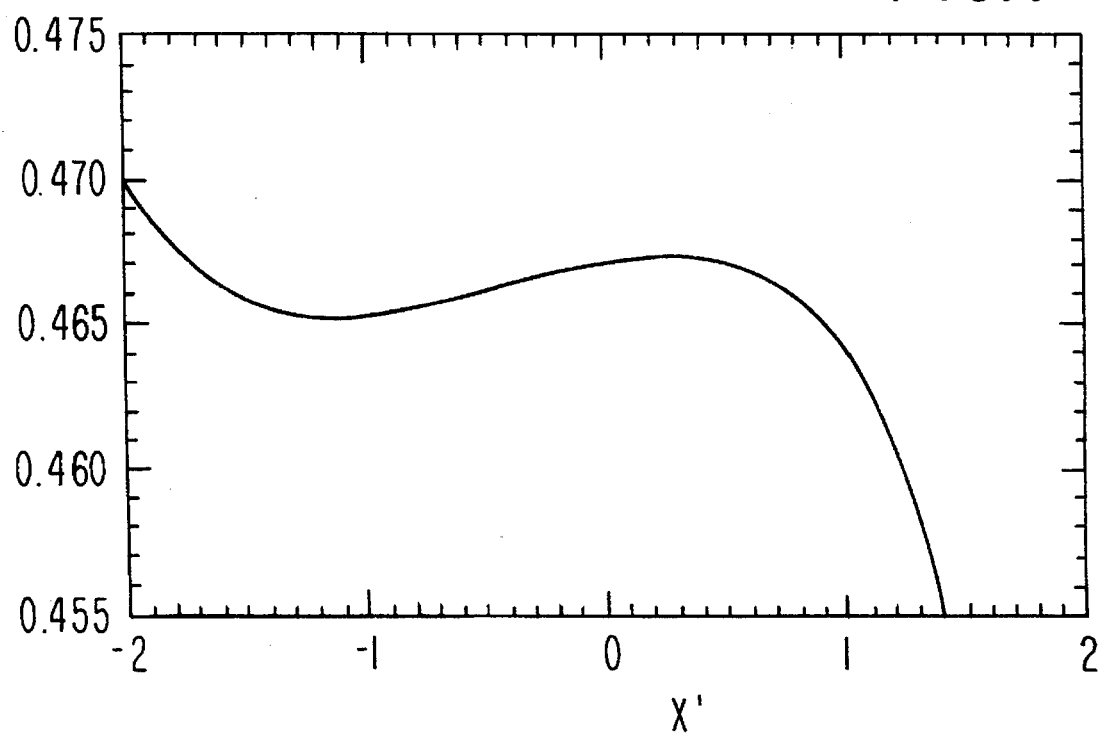
FIG. 14 is a graph of the magnetic field taken along the x' axis for a 0.4 degree tilting of the ferromagnetic plates (shown in FIG. 5)

FIG. 14 illustrates an increase of the tilting angle to 0.4°, which shifts the maximum of $H_y$ toward positive values of x'. Thus the imaging region can be moved in the open region of the cavity by means of the applied field gradient. However, as seen in FIG. 14, the $4.10^{-4}$ variation of the field is achieved in an interval $\delta x' \approx 0.5$, which is smaller than in FIG. 13.

Figure 15:
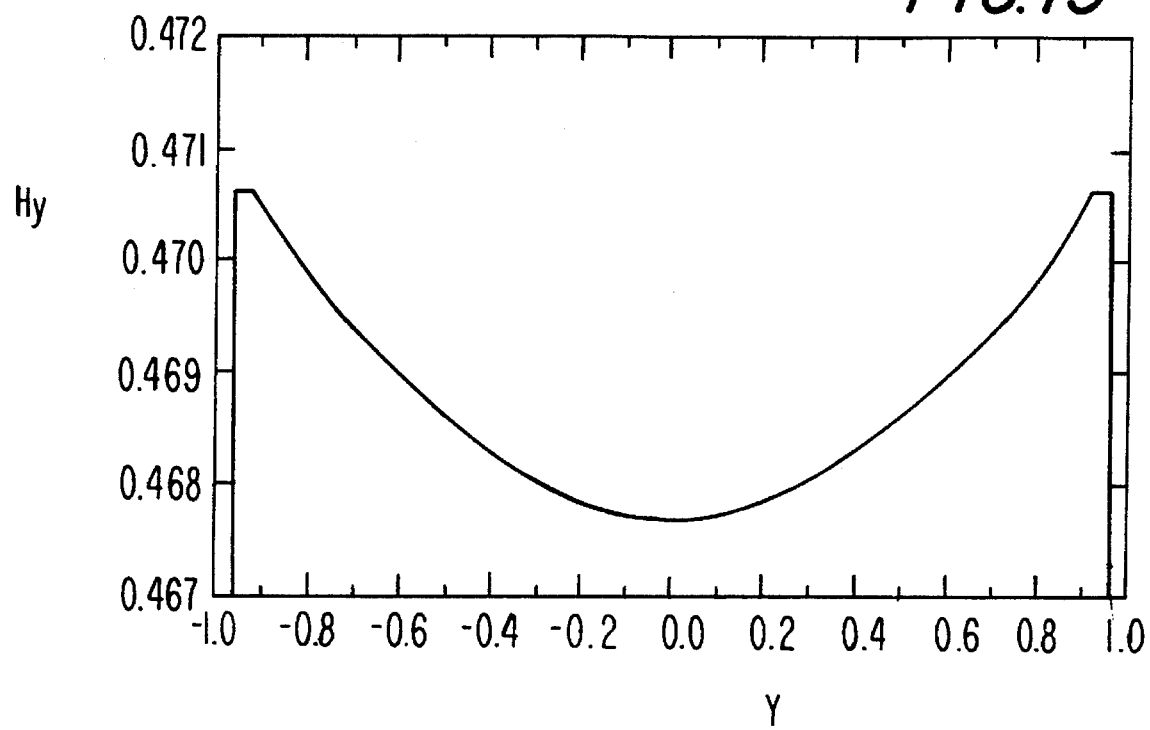
FIG. 15 illustrates a graph of the magnetic field taken along the y axis for a 0.2 degree tilting of the ferromagnetic plates (shown in FIG. 5)
Figure 16:
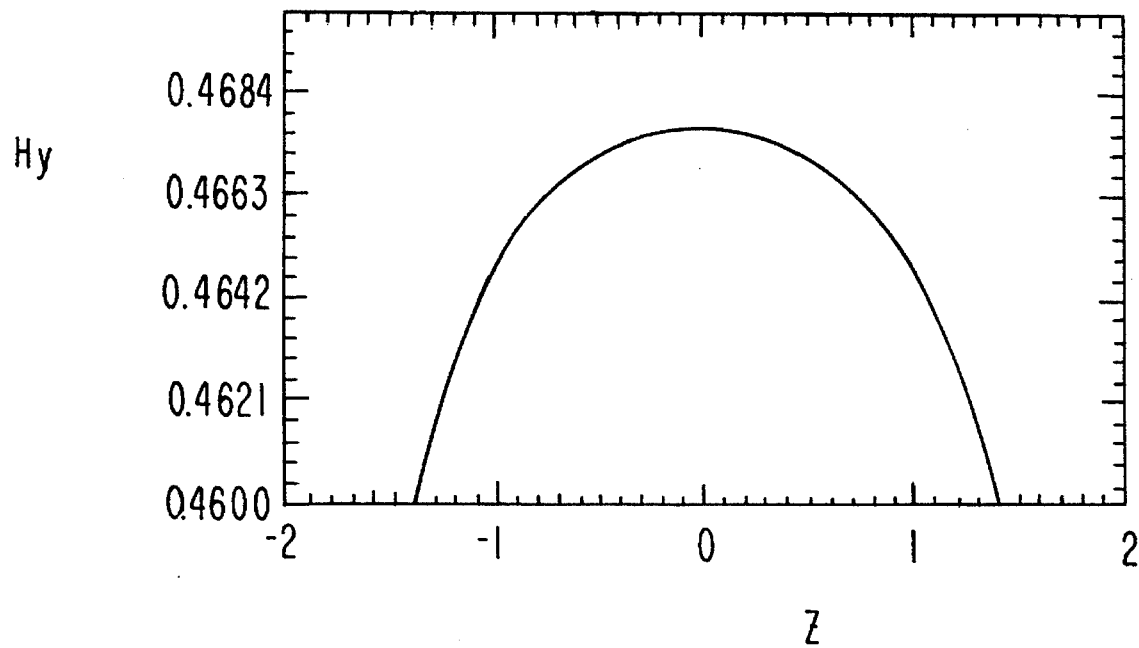
FIG. 16 illustrates a graph of the magnetic field taken along the z' axis for a 0.2 degree tilting of the ferromagnetic plates (shown in FIG. 5)

The gradient in the x' direction generated by the tilting of the plates affects the field in the entire region of the open cavity. This is illustrated in FIG. 15 and 16 which show the $H_y$ component along the y and z' axes for a 0.2° tilting.

Within the region of the cavity between the two $\mu=\infty$ plates, the field can be analyzed quantitatively by expanding the potential in cylindrical harmonics over a cylindrical surface coaxial with axis y and radius $$r_0 < x_0 \tag{2.2}$$

Assume a cylindrical frame of reference $r,\psi,y$, where r is the radial distance from the y axis and the angular coordinate $\psi$ is defined by $$x' = r \cos\psi \tag{2.3}$$

Expansion of the harmonics defined over a cylindrical surface is defined by two integral numbers m and n, where m is the order number of periods along y and n is the number of periods along $\psi$. Thus, within the region $r<r_0, |y|<y_0$, the potential $\Phi$ is given by $$\Phi = \Phi_0 \frac{y}{y_0} + \sum_{m,n} a_{m,n} I_m \left( n\pi \frac{r}{y_0} \right) \cos(m\psi) \sin\left( n\pi \frac{y}{y_0} \right), \tag{2.4}$$

where $\pm\Phi_0$ are the potentials of the two plates located at $\pm y_0$, $I_0$ is the modified Bessel function $$I_m \left( n\pi \frac{r}{r_0} \right) = i^{-m} J_m \left( in\pi \frac{r}{r_0} \right), \tag{2.5}$$

and coefficients $a_{m,n}$ are given by $$\begin{cases} I_m \left( n\pi \frac{r_0}{y_0} \right) a_{m,n} = \frac{4}{\pi y_0} \int_0^\pi d\psi \int_0^{y_0} \overline{\Phi}(r_0,\psi,y) \cos(m\psi) \sin\left( n\pi \frac{y}{y_0} \right) dy, \ (m \neq 0) \\ I_0 \left( n\pi \frac{r_0}{y_0} \right) a_{0,n} = \frac{2}{\pi y\pm} \int_0^\pi d\psi \int_0^{y_0} \overline{\Phi}(r_0,\psi,y) \sin\left( n\pi \frac{y}{y_0} \right) dy, \end{cases} \tag{2.6}$$

where $$\overline{\Phi} = \Phi - \Phi_0 \frac{y}{y_0}. \tag{2.7}$$

The potential $\overline{\Phi}$ represents the field distortion generated by the opening, it is identically zero at $y=\pm y_0$. The quantity $$\frac{1}{y_0} \Phi_0 + H_0 \tag{2.8}$$

represents the loss of the field intensity due to the magnet opening. In the $r,\Phi,y$ frame of reference, the components of the intensity are $$\begin{cases} H_r = -\sum_{m,n} a_{m,n} \left[ \frac{m}{r} I_m \left( n\pi \frac{r}{y_0} \right) + n \frac{\pi}{y_0} I_{m+1} \left( n\pi \frac{r}{y_0} \right) \right] \cos(m\psi) \sin\left( n\pi \frac{y}{y_0} \right) \\ H_\psi = \frac{1}{r} \sum_{m,n} m a_{m,n} I_m \left( n\pi \frac{r}{y_0} \right) \sin(m\psi) \sin\left( n\pi \frac{y}{y_0} \right) \\ H_y = -\frac{1}{y} \Psi_0 - \frac{\pi}{y_0} \sum_{m,n} n a_{m,n} I_m \left( n\pi \frac{r}{y_0} \right) \cos(m\phi) \cos\left( n\pi \frac{y}{y_0} \right) \end{cases}$$
(2.9)

A listing of coefficients $a_{m,n}$ is presented in Table 2.1 below.

TABLE 2.1

Coefficients of the expansion for the open magnet ($\tau/y_0 = 0.7$).

| m | n | $a_{m,n}$ | $n\pi a_{m,n} I_m(n\pi\tau/y_0)$ |
|---|---|---|---|
| 0 | 1 | $2.5 \times 10^{-4}$ | $2.1 \times 10^{-3}$ |
| 0 | 2 | $\sim 10^{-9}$ | $\sim 10^{-7}$ |
| 1 | 1 | $4.4 \times 10^{-4}$ | $2.6 \times 10^{-3}$ |
| 1 | 2 | $\sim 10^{-7}$ | $\sim 10^{-5}$ |
| 2 | 1 | $1.2 \times 10^{-6}$ | $3.2 \times 10^{-6}$ |
| 2 | 2 | $\sim 10^{-9}$ | $\sim 10^{-8}$ |
| 3 | 1 | $-4.5 \times 10^{-4}$ | $-4.2 \times 10^{-4}$ |
| 3 | 2 | $\sim 10^{-7}$ | $\sim 10^{-6}$ |
| 4 | 1 | $-5.3 \times 10^{-4}$ | $-1.3 \times 10^{-4}$ |
| 4 | 2 | $\sim 10^{-7}$ | $\sim 10^{-6}$ |

In the absence of an effect of the part of the soft ferromagnetic yoke contained within $|y|<y_0$, because of the square cross section of the cavity 12, the harmonics with even values of m would be limited to $$m=0,4,8 \quad (2.10)$$

The small values of $a_{2,n}$ listed in Table 2.1 result from the proximity of the ferromagnetic yoke. In particular, $a_{2,1}$ is further reduced by closing the yoke farther away from the magnetized material in the $|y|<y_0$ region. It is of important to observe that the flexibility in choosing the geometry of the ferromagnetic yoke is an advantage of the hybrid structure compared to a yoked magnet where the geometry of the yoke is dictated by the geometry of the permanent magnetized material. The terms with odd values of m are due primarily to the removal of the components of magnetic material in the region $|y|<y_0$, and correspond to the gradient of the potential along the $\psi=0$.

Also shown in Table 2.1 is the listing of the values of $$n\pi a_{m,n} I_m \left( n\pi \frac{r}{y_0} \right) \quad (2.11)$$

for a value of $r_0$ $$r_0=0.7y_0. \quad (2.12)$$

The listing in table 2.1 provides the relative amplitude of the harmonics of the y component of the intensity over the cylinder of radius $r_0$. Note that the size of the magnetic structure dictates generation of higher order harmonics. That is, a magnetic structure may be designed to generate only the lower order harmonics (n=1, m=1,2,3) if the dimensions of the ferromagnetic plates are substantially larger, i.e., at least two times as large as the distance between such plates. The technique for compensation of the field distortion within this cylindrical region will be presented in the following section.

3. Design of Filter Plates

As pointed out in sections 1 and 2 and as seen in FIG. 5, the ferromagnetic plates 20 inserted between the rectangular components 16 of permanent magnetic material and the cavity 12 establish two reference surfaces. The values of the potential at these surfaces are equal in magnitude and have opposite sign. The potential difference between the two plates 20 determines the field intensity that would be available within the cavity 12 if the field between the two plates 20 were uniform. By subtracting this uniform field from the actual field configuration, one obtains a field whose potential is zero on both plates 20. That difference represents the distortion of the field of the magnetic structure due to its opening. The implementation of the field correction in the magnet design in accordance with the invention aims at eliminating only the distortion, without correcting for the field loss due to the opening.

The field correction implemented in this design is based on controlling the potential of the surface of the main ferromagnetic plates 20 outside the cylindrical region of radius $r_0$ adopted in the field expansion of section 2. The cylindrical region is slightly larger than the imaging region. This is accomplished by inserting elements of permanent magnetized material such as rare earth alloys between the body of each main ferromagnetic plate 20 and a number of insulated soft ferromagnetic plates 24 that interface with the cavity 12. The permanent magnetic material polarizes the insulated plates 24 to generate a different potential at their surface than at the surface of the main ferromagnetic plates 20. Thus, each of the two main plates support a number of insulated plates 24, each having a different potential relative to the main ferromagnetic plate, depending upon the amount and magnetization of the inserted material. The insulated plates are hereinafter referred to as "filter plates." By "insulated" it is meant that the filter plates 24 are spaced from the ferromagnetic plate 20.

Figure 1:
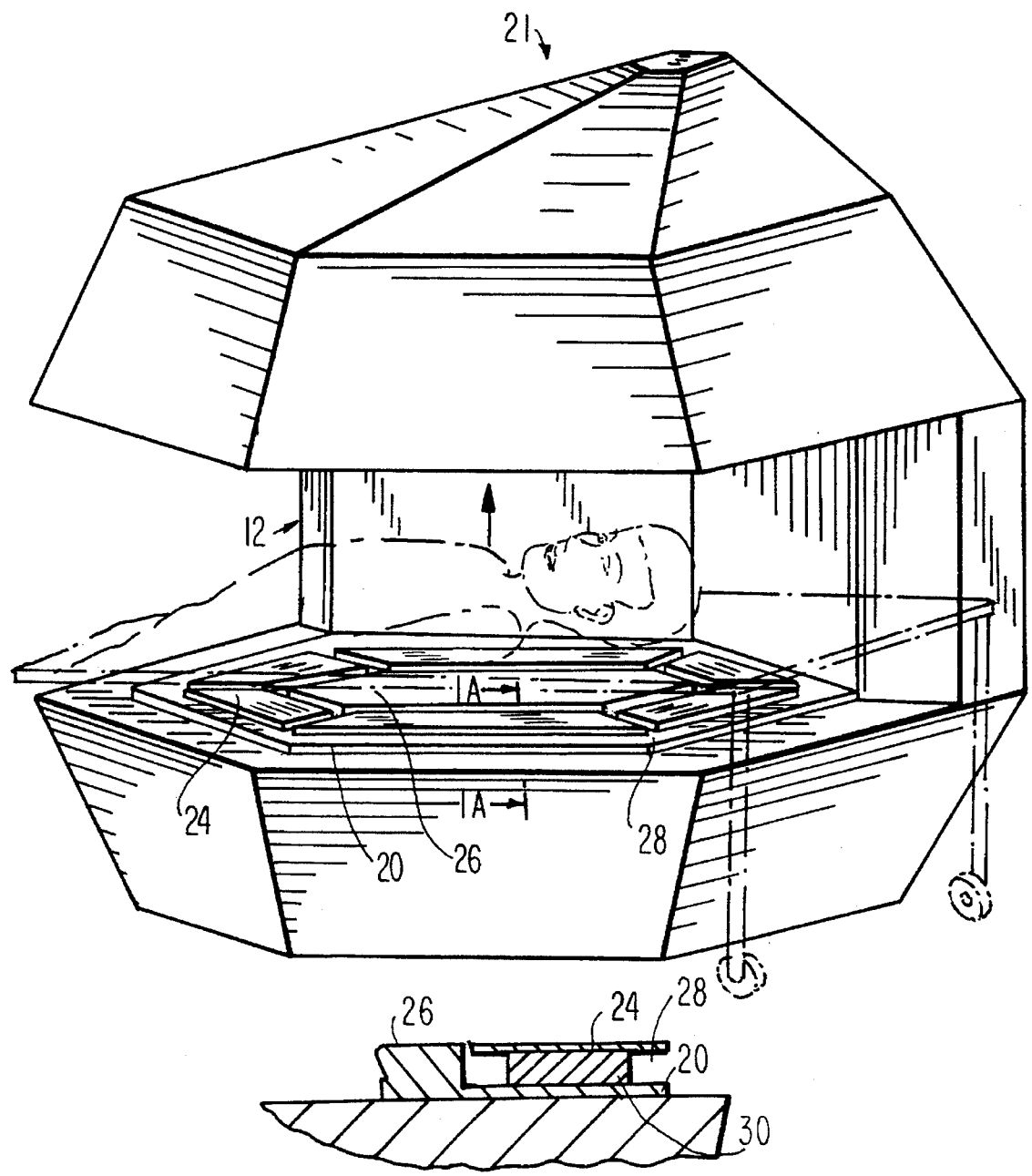
FIG. 1 is a perspective view a magnetic structure incorporating the filter plate structure according to one embodiment of the present invention, showing in phantom the position of a portion of a human figure within the cavity of such structure.

The filter plates are best seen in the perspective view shown in FIG. 1 of a magnetic structure according to one embodiment of the present invention. In this figure, a hexagonal magnetic structure 21 is shown with four open sides to permit access to the cavity 12 for human entry. The ferromagnetic plates 20 are shaped as a trapezoid. The filter plates 24 are equally spaced from each other and spaced radially from the center of the main ferromagnetic plate 20. The filter plates 24 are positioned in a recess 28 located along the periphery of the ferromagnetic plates 20. Each filter plate 24 is attached to, but magnetically insulated from the main ferromagnetic plate 20.

As best seen in FIG. 1A, in the preferred embodiment, each filter plate 24 has a surface exposed to the cavity 12 which is aligned in the same plane as the surface of the raised portion 26 of the ferromagnetic plate 20. The filter plates 24 however need not be at the periphery of the main ferromagnetic plate 20. The filter plates 24 are arranged in the shape of a ring. Within the boundaries of the main ferromagnetic plates 20, the filter plates 24 are spaced the largest radial distance from the center of the imaging region to minimize the distortion effects that the filter plates 24 themselves may cause within the imaging region. The design requirements for the position and shape of the filter plates 24 and the basis for such requirements will be described in more detail below.

In FIG. 1, each main ferromagnetic plate 20 supports a six filter plates 24, each having a different potential relative to the main ferromagnetic plate 20, depending upon the amount and magnetization of the inserted material 30. The inserted material 30 is shown in FIG. 1A. The six filter plates provided at the top of the ferromagnetic plate 20 are not shown.

Figure 17:
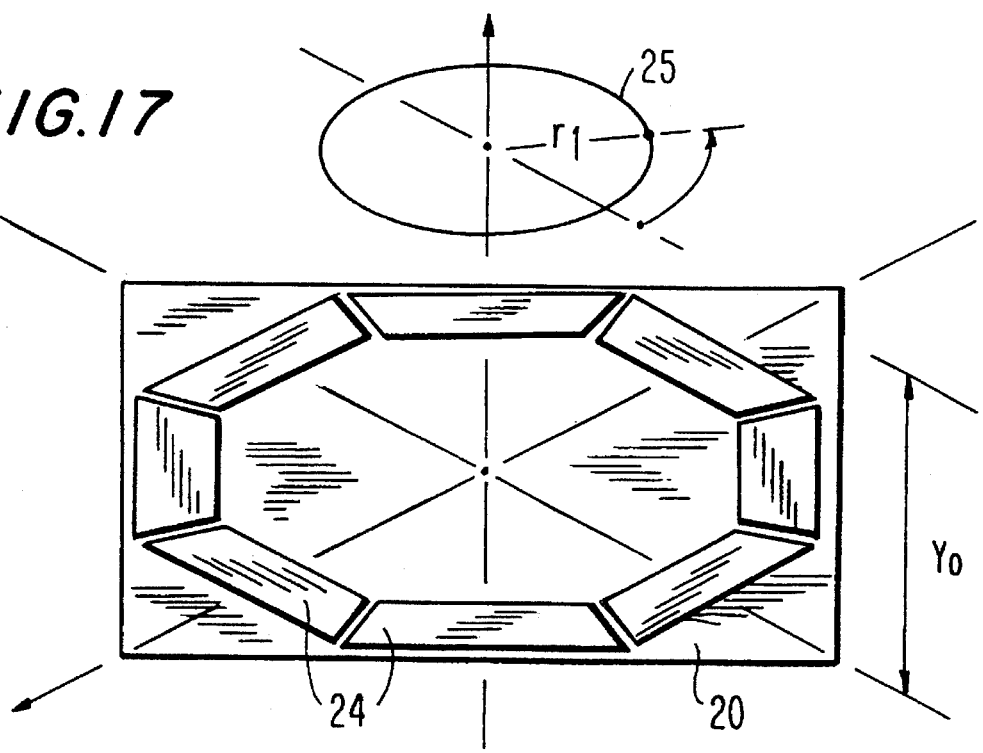
FIG. 17 illustrates a top angled perspective view of eight individual ferromagnetic filter plates arranged in an octagonal configuration and positioned relative to the main ferromagnetic plate as used in the magnetic structure shown in FIG. 7 according to another embodiment of the present invention.

The preferred embodiment of the filter plate configuration is shown in FIG. 17. In this embodiment, there is shown an octagonal configuration for the filter plates 24. Note that the number of filter plates is dictated by the value m. That is, because the value of m defines the number of periods of a sinusoid (harmonic), along, $\psi$, one needs at least twice the value of m (2m) to represent or recreate the periods of that sinusoid. That means that the magnetic structure requires at least twice the value of m to eliminate the appropriate harmonics. The precise number of filter plates is determined by the number required to eliminate those harmonics calculated that must not be disregarded. For example, if the value of m=6 then there are six full periods which requires at least 12 filter plates. Additional filter plates may be added in order to eliminate the harmonics calculated. In the initial stage of design of the magnetic structure, it is determined which harmonics must be eliminated and which may disregarded. This decision is based on the amplitude of the harmonic. Generally, harmonics having amplitudes of the order of 1×10−7 can be disregarded.

The filter plate configuration is confined to the region of the main ferromagnetic plate 20 outside a circle 25 of radius $r_1$ with its center concentric, i.e., coinciding with the center of the plate 20. The circular arrangement of the filter plates is suggested by the fact that the term m=0, n=1 is the dominant component of the distortion, as shown in Table 2.1.

Figure 18:
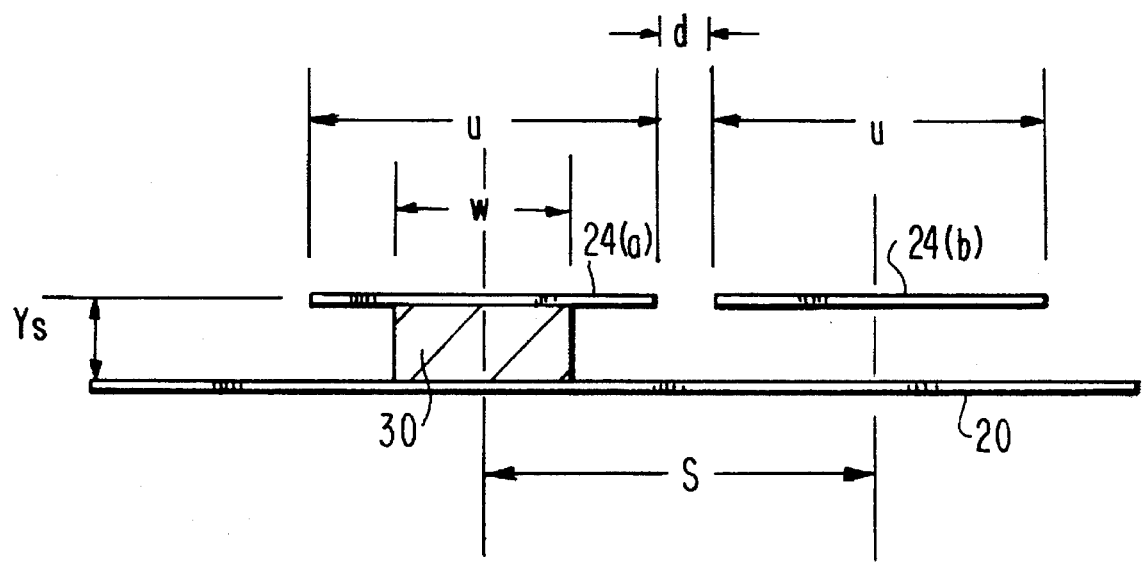
FIG. 18 is a cross sectional view of the plate structure shown in FIG. 17.

A two-dimensional schematic of two adjacent filter plates 24 is shown in FIG. 18. A plate of rectangular cross section $\mu=\infty$ and material is located at a distance $y_s$ from the plane surface also of a $\mu=\infty$ material. The space between the filter plate 24(a) and main plate 20 is partially filled with magnetic material 30 magnetized perpendicularly to the plane surface. The second filter plate 24(b) is also located the distance $y_s$ from the plane surface, as shown in FIG. 18.

In the limit of infinite length, the surface of the main plate 20 acts like a perfect mirror and, as a consequence, the filter plates shown in FIG. 18 can be analyze as the system of the four plates of rectangular cross section plates as shown in FIG. 19. FIG. 19 shows the dimensions of the four plates and their relative position.

Consider first a single partially filled filter plate and main plate configuration where the magnetic material 30 is centered within the plates, as shown in FIG. 19. FIG. 20 shows the potential $\Phi_1$ generated in this single plate configuration as a function of the dimension $\omega$ of the cross section of the magnetic material. The linearity of the function is maintained almost over the entire dimension of the filter plate structure, which indicates that the potential generated by the magnetic material depends only on the amount of filling and not on the position of the material between the filter plate and main ferromagnetic plate. That is, the potential on the surface of the main ferromagnetic plates is controlled by one parameter, namely the quantity of filling between the filter and main plate. Neither the position nor the geometry of the magnetic material between these plates is relevant.

FIG. 20 also shows a plot of the potential $\Phi_1$ of the partially filled plate structure versus the quantity of firing, for different values of the distance (d) between adjacent filter plates. As a result of the linear relationship between potential and quantity of filling, in the limit d=0 (where the two filter plates are contacting one another) the potential of the filter plate structure is half the value of the potential computed when d=∞.

Figure 21:
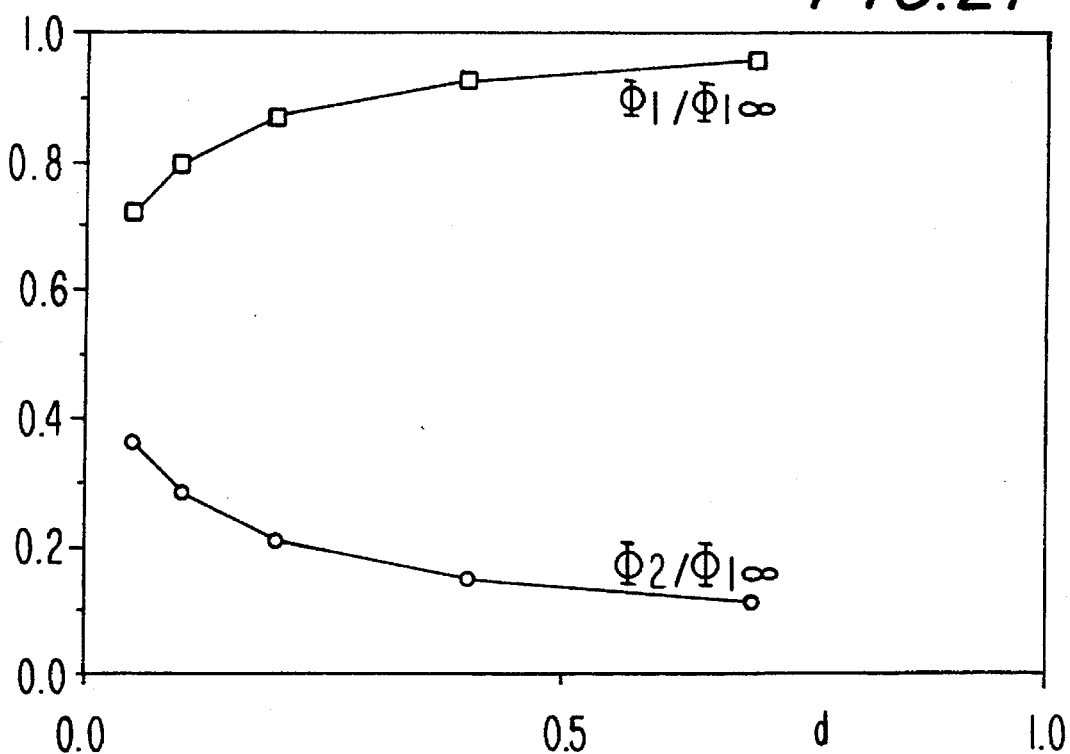
FIG. 21 illustrates a graph of the coupling between filter plate and main plate structures shown in FIG. 17.

The values of the potential $\Phi_1$ and the potential $\Phi_2$ of the filter plate structure with no filling therebetween are plotted versus the distance d in FIG. 21. The result plotted in FIG. 21 provides the coupling between the two adjacent plates defined as $$\Phi_m = \frac{\Phi_2}{\Phi_1}, \tag{3.1}$$

Figure 22:
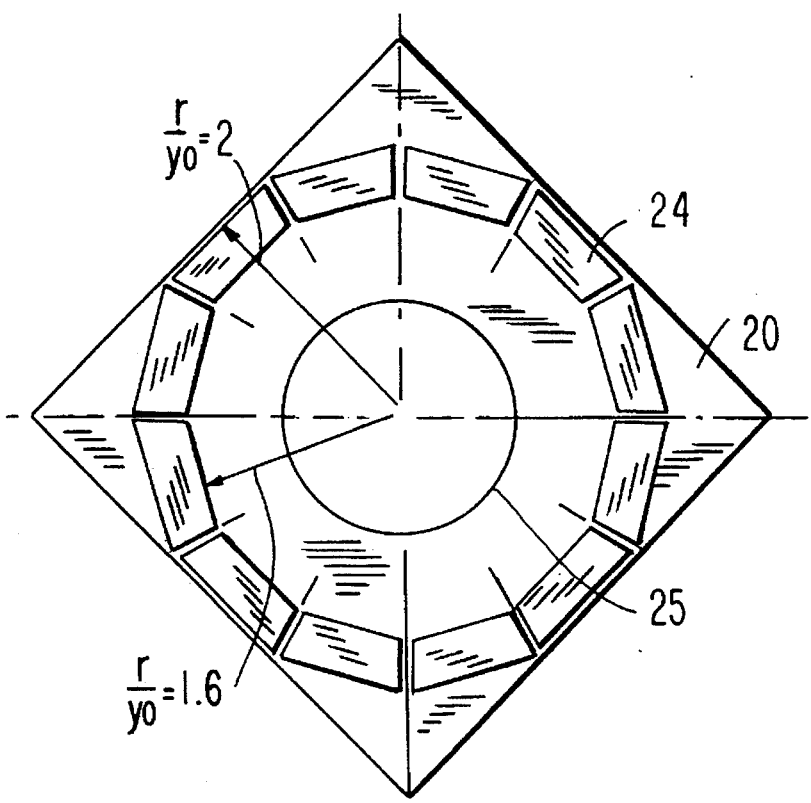
FIG. 22 illustrates a plan view of a dodecogonal ring configuration of the individual filter plates concentric with the center of the main ferromagnetic plate according to another embodiment of the present invention.

FIG. 22 shows the filter plates arranged in a regular dodecogonal distribution in the shape of a ring, concentric with the center of the plate. The filter plates are arranged in the shape of a ring so that the plates will have an equal effect on the distortion in the imaging region 25. Table 3.1 shows the values of the distribution of potentials of the twelve filter plates that generate the n=1 harmonics $$(0,1),(1,1),(2,1),(3,1),(4,1) \tag{3.2}$$

If one assumes a value $$10^{-5}H_0 \tag{3.3}$$

as the order of magnitude of the amplitude of each harmonic of the field distortion to be compensated by filter plate structure, table 2.1 from the previous section has shown that the correction should be extended to the five spatial harmonics $$(0,1),(1,1),(1,2),(3,1),(4,1). \tag{3.4}$$

A single ring of filter plates can eliminate the lower order harmonics (n=1, m=1,2, etc.) but cannot compensate for the higher order harmonics having the same value of m and higher values of n. Consequently, correcting structures must be devised to compensate for the (1,1) and (1,2) harmonics independent of and in addition to the ring of filter plates 24 adjacent each main ferromagnetic plate 20. The most suitable arrangement is shown in FIG. 23 which illustrates two full tings 32, 34 of filter plates located in planes at +y and −y and an additional half ring 36 of filter plates located in the plane y=0, in the region x'<0. The additional half ring 36 may generate its own harmonics unless the ring and its orientation of magnetization are properly positioned.

Figure 24:
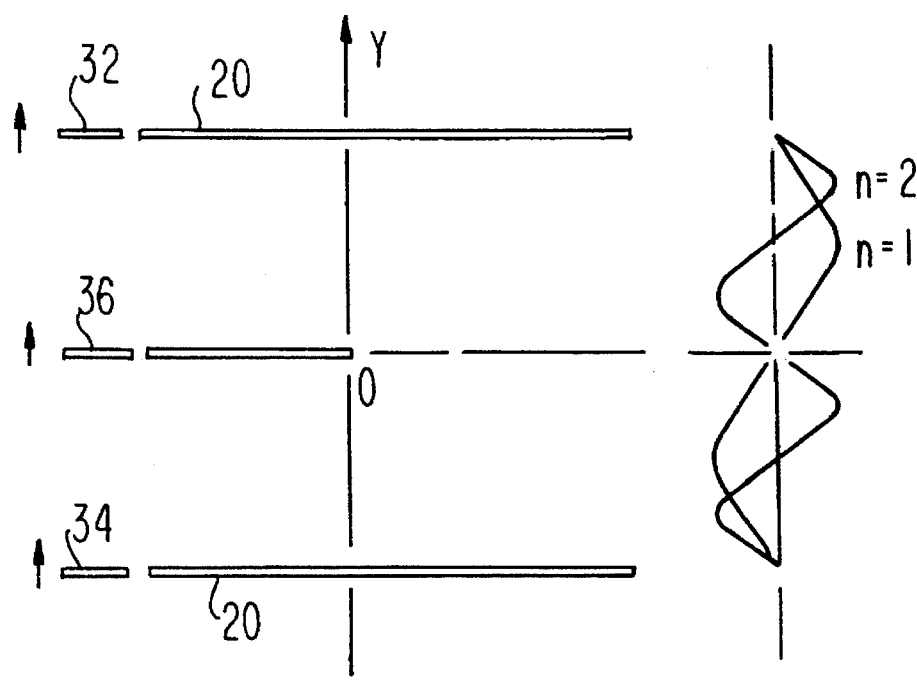
FIG. 24 illustrates a side view of the position of the rings of individual plates relative to the distribution of n=1, n=2 harmonics of the potential versus y.

FIG. 24 illustrates the role of the ring 36 of filter plates distributed on the y=0, x'=0 plane. The two sinusoids are the distributions of the n =1 and n =2 harmonics of the potential along the axis y, and the arrows indicate the orientation of the magnetization of the two ring of plates 32, 34 and on the ring of plates 36 in the y=0 plane. The same direction of magnetization and a magnitude of the dipole moment of the y=0 filter plates twice the magnitude of the dipole moment of the filter plates attached to the two ferromagnetic plates yields a predominant n=2 harmonic. Alternatively, the inversion of the direction of the dipole moment of the y=0 filter plate yields a predominant n=1 harmonic.

TABLE 3.1

Potentials on the sandwich elements shown in FIG. 22 that generate pure n = 1 harmonics (n ≧ 2 harmonics neglected.)

| m | $\Phi_1$ | $\Phi_2$ | $\Phi_3$ | $\Phi_4$ | $\Phi_5$ | $\Phi_6$ |
|---|---|---|---|---|---|---|
| 0 | 116 | 105 | 116 | 117 | 107 | 117 |
| 1 | 105 | 70 | 27 | −28 | −72 | −106 |
| 2 | 77 | 0 | −77 | −77 | 1 | 77 |
| 3 | 45 | −42 | −42 | 43 | 42 | −45 |
| 4 | 20 | −37 | 20 | 20 | −37 | 20 |

Assume that the half ring filter plate distribution 36 in the y=0 is composed of six filter plates. Table 3.2 shows the amplitude of the harmonics generated by the six filter plates alone for two distributions of Potential of the full ring of filter plates 32, 34.

TABLE 3.2

Coefficients of expansion generated by the half ring at y = 0 (τ/y₀ = 0.7).

| m | n | $a_{m,n}$ | $n\pi a_{m,n} I_m(n\pi\tau/y_0)$ |
|---|---|---|---|
| 0 | 1 | $5.0 \times 10^{-3}$ | $4.1 \times 10^{-2}$ |
| 0 | 2 | $3.1 \times 10^{-5}$ | $3.1 \times 10^{-3}$ |
| 1 | 1 | $-6.9 \times 10^{-3}$ | $-4.1 \times 10^{-2}$ |
| 1 | 2 | $-4.3 \times 10^{-5}$ | $-3.8 \times 10^{-3}$ |
| 2 | 1 | $-6.2 \times 10^{-5}$ | $-1.7 \times 10^{-4}$ |
| 2 | 2 | $-3.2 \times 10^{-7}$ | $-1.9 \times 10^{-5}$ |
| 3 | 1 | $4.5 \times 10^{-3}$ | $4.2 \times 10^{-3}$ |
| 3 | 2 | $1.8 \times 10^{-5}$ | $6.0 \times 10^{-4}$ |
| 4 | 1 | $1.5 \times 10^{-4}$ | $3.7 \times 10^{-5}$ |
| 4 | 2 | $1.0 \times 10^{-6}$ | $1.5 \times 10^{-5}$ |

TABLE 3.3

Coefficients of expansion generated by the half rings at y = ±y₀/2(τ/y₀ = 0.7).

| m | n | $a_{m,n}$ | $n\pi a_{m,n} I_m(n\pi\tau/y_0)$ |
|---|---|---|---|
| 0 | 1 | $-2.4 \times 10^{-4}$ | $-1.9 \times 10^{-3}$ |
| 0 | 2 | $-4.5 \times 10^{-5}$ | $-4.5 \times 10^{-3}$ |
| 1 | 1 | $3.2 \times 10^{-4}$ | $1.9 \times 10^{-3}$ |
| 1 | 2 | $6.0 \times 10^{-5}$ | $5.3 \times 10^{-3}$ |
| 2 | 1 | $7.4 \times 10^{-6}$ | $2.1 \times 10^{-5}$ |
| 2 | 2 | $3.9 \times 10^{-7}$ | $2.3 \times 10^{-5}$ |
| 3 | 1 | $-2.9 \times 10^{-4}$ | $-2.7 \times 10^{-4}$ |
| 3 | 2 | $-2.4 \times 10^{-5}$ | $-7.9 \times 10^{-4}$ |
| 4 | 1 | $3.6 \times 10^{-5}$ | $8.8 \times 10^{-6}$ |
| 4 | 2 | $-6.0 \times 10^{-6}$ | $-9.1 \times 10^{-5}$ |

TABLE 3.4

Sandwich potentials that generate pure (m = 1, n = 1) and (m = 1, n = 2) harmonics.

| j | $\Phi_j$ (m = 1, n = 1) | $\Phi_j \times 10^{-2}$ (m = 1, n = 2) |
|---|---|---|
| 1 | 108 | 9 |
| 2 | 63 | −23 |
| 3 | 37 | 35 |
| 4 | 20 | 154 |
| 5 | −13 | 191 |
| 6 | −52 | 174 |
| 7 | −48 | −157 |
| 8 | −48 | −157 |
| 9 | −48 | −157 |

The effectiveness of the multiple ring layers for filtering out each harmonic of order n, increases by increasing the number of the half circles. Assume, for instance, that the half ring 36 layer on the y=0 plane is replaced by two half circle layers located at y=±y₀/2. Table 3.3 shows the amplitude of the harmonics generated by the two half ring layers alone.

Table 3.4 shows the distribution of potential of the entire filter/main plate structures designed to generate either the (1,1) or (1,2) harmonic.

Figure 23A:
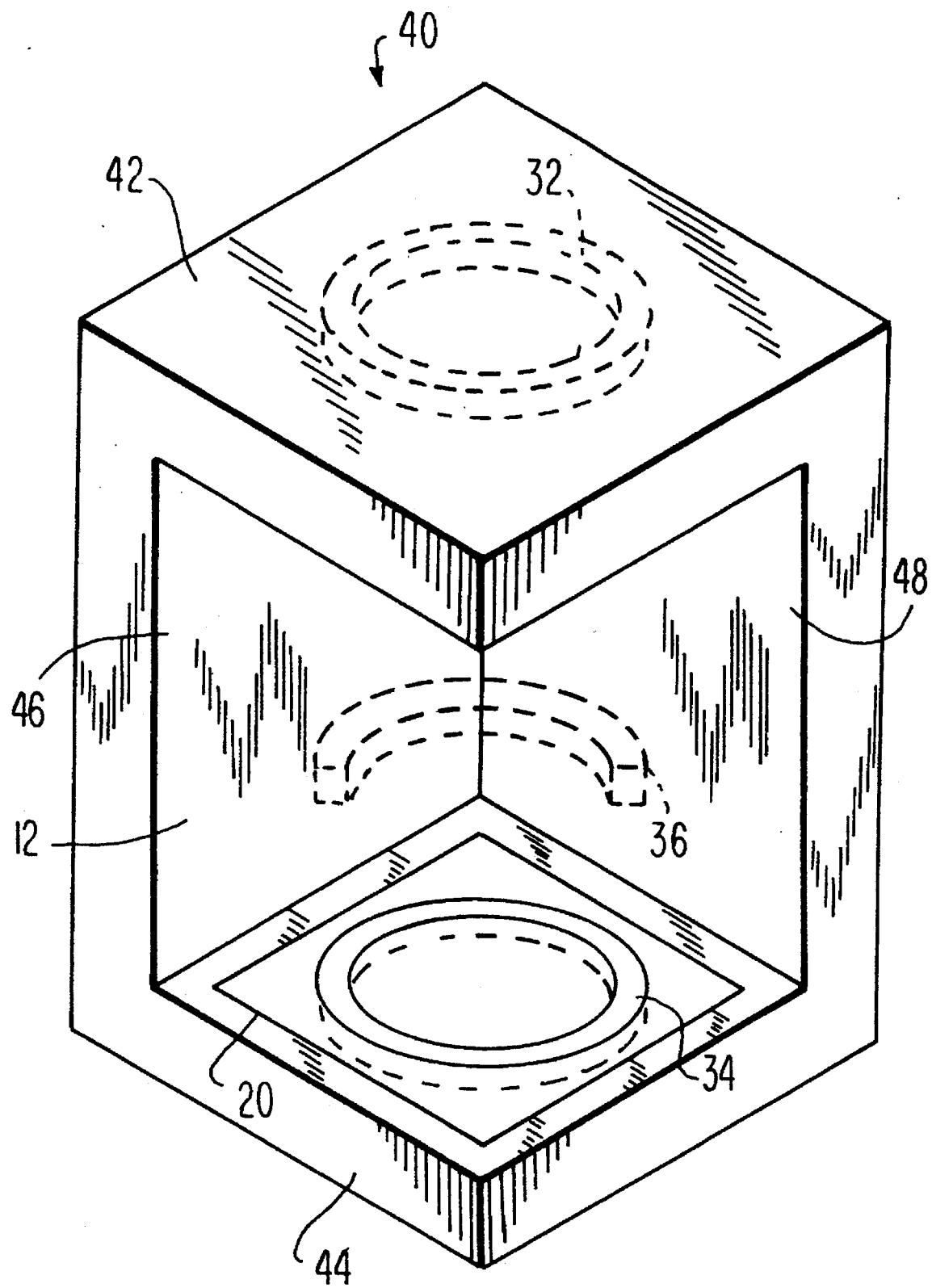
FIG. 23(a) is a perspective view of a square magnetic structure incorporating multiple rings of filter plates in accordance with a preferred embodiment of the present invention.
Figure 23:
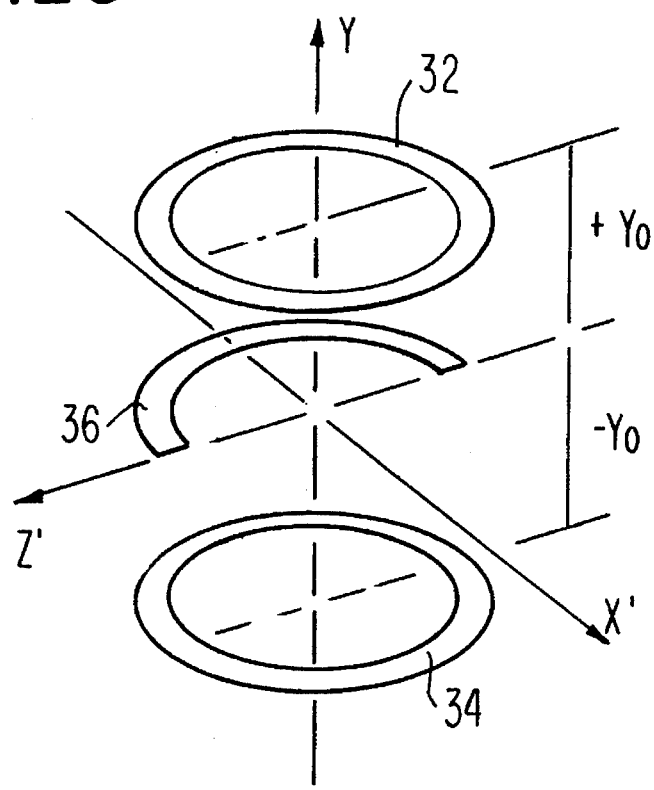
FIG. 23 illustrates an additional half ring of filter plates located in the y=0 plane between the two full rings of filter plates.

FIG. 23(a) illustrates a square magnetic structure 40 and the construction and placement of the ring structures described above. The square magnetic structure 40 is made of permanent magnetic material. No external yoke of ferromagnetic material however is shown. The structure 40 has four sides, two of which are open to expose the cavity 12. There are two full rings 32, 34 of filter plates, one shown in dotted lines in the top ferromagnetic plate 20 (not shown) in the top rectangular portion 42, and one shown in the main ferromagnetic plate 20 on the bottom rectangular portion 44 of the magnetic structure. A half ring 36 of filter plates is also shown disposed midway between the rings 32, 34. The half ring 36 is supported by and embedded in the walls 46, 48 of the magnetic structure 40. Specifically, a circular recess is carved into the walls 46,48 of the structure 40. The filter plates of the half ring 36 are attached to the structure 46,48, within the recess, but magnetically insulated from the walls 46,48. The half ring 36 lies in the y=0 plane which is parallel to the plane of full rings 32,34. In the recess, there is enough space to hold the ferromagnetic plates and the magnetized material of the half ring 36.

As described above, in a preferred embodiment of the invention, the magnetic structure is open on two (2) sides, producing the generally C-shaped configuration illustrated in FIG. 1. This however is not essential. It can also be open on three (3) or four (4) sides. In the case of the latter, the upper and lower halves could be supported by an insulating structure from the top and bottom, respectively. While the filter plates in the preferred embodiment are shown of similar sizes and shapes arranged as a ring symmetrically around the imaging region at the center, this too is not essential. The filter plates need not be in a ring configuration and are added as individual elements wherever a field distortion correction is required. The location of the filter plates will always be outside of an imaging region generally considered as a cylinder whose outer diameter will be less than the inner diameter of a ring formed by the annularly-arranged filter plates. The basic reason is that adding a ring of filter plates to compensate for a lower-order harmonic field distortion often results in an increase in a normally-lower value of a higher harmonic of the field potential. Since the higher harmonic potential declines exponentially with distance from the filter plate, keeping the compensating filter plates outside of the imaging region helps to maintain field distortion low.

Similarly, while the filter plates are shown embedded in the surface of the main magnets halves, with the cavity-interfacing surface of the filter plate flush with or at the same level as the cavity-interfacing surface of the main magnet, this, again, is not essential but is preferred in order to maximize the available cavity space.

It will also be recognized that, while the invention has been described in connection with a 0.2T system, the invention is not so limited but applies with equal force to magnetic structures with higher or lower field intensities. Similarly, while a preferred and important application is directed to a magnetic structure producing a uniform field in a region of interest or imaging region, the invention is also applicable to magnetic structures producing graded fields. Also, the invention is not limited to the hybrid system disclosed in the preferred embodiments, but is also applicable to yokeless, and yoked systems.

It is also important to note that the configuration of the gradient coils which generate the magnetic field in the magnetic structure in an MRI application is conventional and is well known to one of ordinary skill in the art and therefore will not be discussed herein.

4. Design Considerations

The cross section of the closed magnet in a plane perpendicular to a side of the cavity is shown in FIG. 3. A view of the magnetic structure perpendicular to the y axis is shown in FIG. 25. One observes that the interfaces between the lateral pieces are the $$\frac{x}{y_0} = \pm 2, \frac{z}{y_0} = \pm 2.$$

The proposed magnetic material for this example is Ferrigmag 8D produced by Crucible Magnetics. The thickness of the ferrite tiles along the easy axis is 25 min. Assume that the dimensions of the prismatic rectangular components along the direction of the field is an integral multiple of the tile thickness. Thus, regardless of the thickness of the plates, for K=0.5, the cavity dimension along the y axis can be chosen as which corresponds to six layers of tile in the rectangular components, or as $$2y_0 = 30 \text{ cm}, \quad (4.1)$$

$$2y_0 = 35 \text{ cm} \quad (4.2)$$

which corresponds to seven layers.

The design of the triangular cross section components of FIG. 3 must take into account the value of the coercive force of Ferrimag 8D. The 30° angle shown in FIG. 3 corresponds to the ideal limit $x_m = 0$. The demagnetization characteristic of Ferrimag 8D bends sharply as the intensity approaches the coercive force which has a value $$H_c \approx 3550 \text{ Hoersteds}. \quad (4.3)$$

Figure 25A:
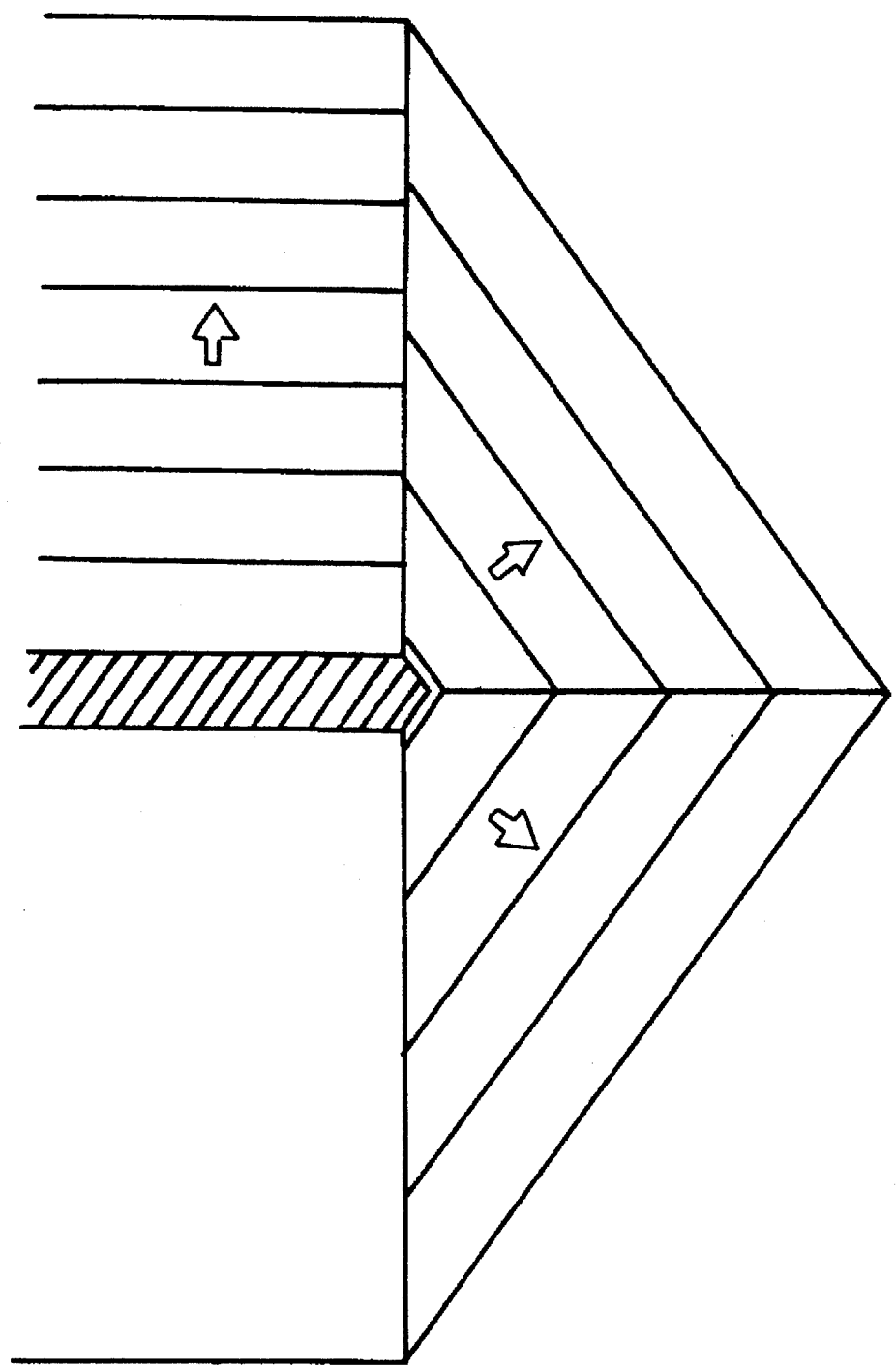
FIG. 25(a) is a cross sectional view of the triangular components shown in FIG. 3.
Figure 25:
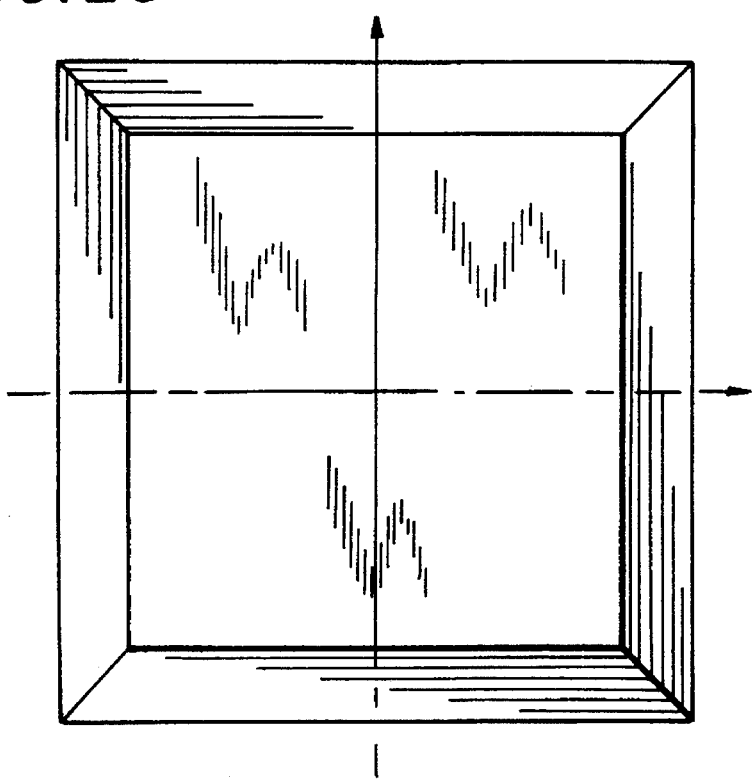
FIG. 25 is a view of the magnetic structure shown in FIG. 3 perpendicular to the y axis.

As a consequence, if one disregards the effect of $\chi_m = 0$ in the rectangular components, the angles of FIG. 3 become $$\alpha \approx 36.66°, \quad (4.4)$$

as indicated in FIG. 25(a). As seen in that figure, for seven layers of the rectangular components, the distance between the lateral surface of the plate and the external boundary of the triangular pieces is not an integral multiple of the thickness of the ferrite tiles. This distance is made equal to the thickness of four tiles if $\alpha$ is changed to $$\alpha \approx 35°. \quad (4.5)$$

If a 35° angle is adopted, the effect of the angular error can be compensated as part of the material tolerances because the orientation of the magnetization in each tile is known with a precision of 1°–2°. The invention is not limited to the use of hard ferrites but also encompasses other well known magnetic materials such as the Nd alloys.

The analysis of the preceding Sections has been conducted for the ratio $x_0/y_0 = 2$ of the cavity dimensions. This ratio is the basic parameter that determines the amplitude of the spatial harmonics of the field. The dependence of the spatial harmonics on the value of $x_0/y_0$ can be assessed by computing the coefficients $a_{m,n}$ for a 10% reduction of the value of $x_0$, i.e., $$\frac{x_0}{y_0} = 1.8. \quad (4.6)$$

The results are presented in table 4.1 below.

TABLE 4.1

Coefficients of the expansion for the open magnet with $x_0 = 1.8 y_0$.

| m | n | $a_{m,n}$ | $n \pi a_{m,n} I_m(n \pi \tau / y_0)$ |
|---|---|---|---|
| 0 | 1 | $4.3 \times 10^{-4}$ | $3.6 \times 10^{-3}$ |
| 0 | 2 | $\sim 10^{-7}$ | $\sim 10^{-5}$ |
| 1 | 1 | $8.0 \times 10^{-4}$ | $4.8 \times 10^{-3}$ |
| 1 | 2 | $\sim 10^{-6}$ | $\sim 10^{-5}$ |
| 2 | 1 | $-7.4 \times 10^{-6}$ | $-2.1 \times 10^{-5}$ |
| 2 | 2 | $\sim 10^{-7}$ | $\sim 10^{-5}$ |
| 3 | 1 | $-8.2 \times 10^{-4}$ | $-7.7 \times 10^{-4}$ |
| 3 | 2 | $\sim 10^{-7}$ | $\sim 10^{-5}$ |
| 4 | 1 | $-9.2 \times 10^{-4}$ | $-2.2 \times 10^{-4}$ |
| 4 | 2 | $\sim 10^{-6}$ | $\sim 10^{-5}$ |

The 10% reduction of dimension $x_0$ doubles the significant coefficients listed in table 2.1, and, as a consequence, about twice the amount of magnetic material is required to compensate for the field distortion.

The design and development of the filter plates and tuning procedure involve the following steps:

1. Design of the ferromagnetic plate and filter plate structure.
2. Determination of the optimum distribution of magnetic material required to generate the field harmonies computed in the design phase.
3. Design of the mechanical control of the shimming components of the filter plates.
4. Measurement and tuning of each filter plate outside the magnet.
5. After assembly of the full magnet, compensation of the fabrication tolerances by means of the mechanical control of the shimming components of the filter plate/main plate structure.

With a cavity dimension 30 cm×60 cm×60 cm, each plate is a 60 cm×60 cm square with a thickness determined primarily by the amount of material contained in each sandwich. As shown in FIG. 22, the polygonal filter plate ring structure of each ferromagnetic plate is located outside a circle of radius $$\frac{r}{y_0} = 1.6.$$

It consists of twelve elements arranged on a regular dodecagon whose internal boundary circumscribes the circle of radius $$\frac{r}{y_0} = 1.6.$$

Figure 26:
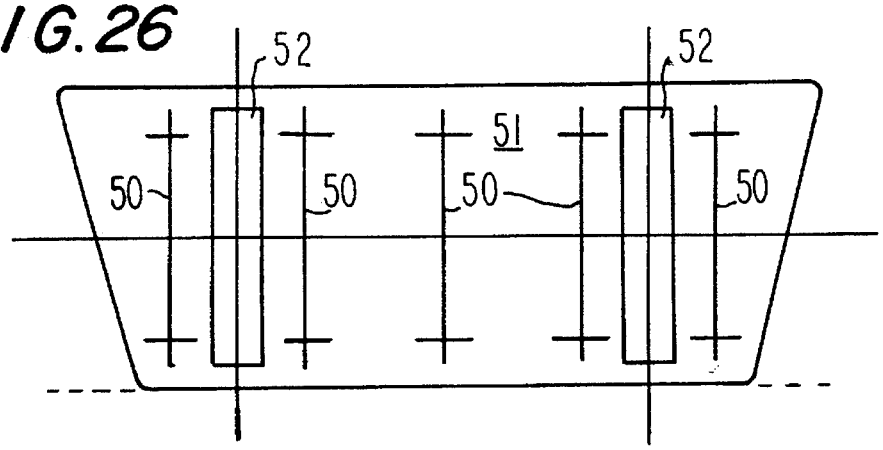
FIG. 26 is a top plan view of a filter plate with two rods positioned thereover.

The external boundary circumscribes the circle radius $$\frac{r}{y_0} = 2$$

as indicated in FIG. 22. FIG. 26 shows a plan view of one of the twelve filter plates and FIG. 27 shows a cross section thereof.

Figure 27:
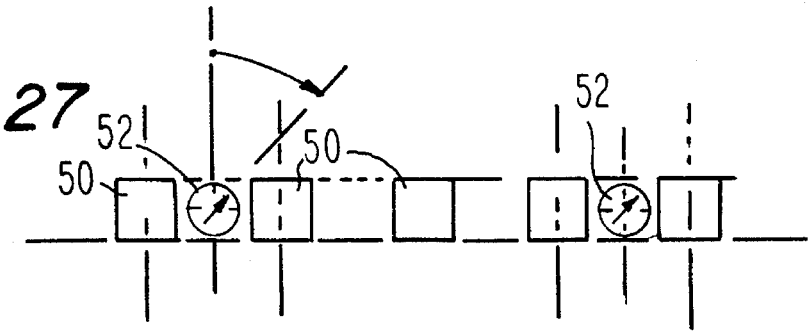
FIG. 27 is a cross sectional view of five square rods and two cylindrical rotateable rods magnetized in the direction perpendicular to their axis.

A frame (not shown) of non-magnetic material is inserted between the two ferromagnetic main plates 20 of the magnetic structure. The frame is designed to house and hold components of magnetized material, designed to tune the magnetic structure of the main plates before the filter plates are installed in the magnet and to shim the full magnet after filter plate installation. The spacing between each filter plate and the main plate is $$t = 12 \text{ mm} \quad (4.7)$$

as indicated in FIG. 27. The dimensions of each of the twelve filter plates allow for the insertion of up to seven blocks of magnetic material of dimensions $$12 \times 12 \times 40 \text{ mm}^3 \quad (4.8)$$

magnetized in a direction perpendicular to one of the filter plate $12 \times 40$ mm$^2$ faces. In each filter plate structure 51 (see FIG. 26) only a part of the seven available housings need to be filled with the material (either Nd alloy or ferrite or a combination of both) on the basis of the results of Section 3. The remaining available space of the housings is used for the tuning of each assembled filter plate outside the magnet. FIGS. 26 and 27 illustrate an alternative way to adjust magnetostatic potential on a filter plate 51. The alternative way provides a set of permanent magnetized rods as a substitute for the magnetic inserts 30 in FIG. 1A.

FIG. 27 shows two rods of circular cross section 52 magnetized in the direction perpendicular to their axis and five rectangular rods 50. If the angular orientation of the rods 50,52 is such that their magnetization is parallel to that of the main ferromagnetic plates, the rods do not affect the filter plate potential. The rods 52 can be rotated to generate a component of the magnetization perpendicular to the main ferromagnetic plates, thereby providing a mechanical adjustment of the filter plate potential that can be performed in the assembled magnet for the final shimming. Assume a 50 mm length of the two rods 52 and a 10 mm diameter. Assume also an average filling of five NdFeB rods 50 of dimensions given by Eq. 4.8. The ratio of volume $V_c$ of the two cylinders to the volume $V_r$, of the five rods is $$\frac{V_c}{V_r} \approx .27. \quad (4.9)$$

As a consequence, if the two cylindrical rods 52 are built with hard ferrite material, the effective ratio of the dipole moments is $$\frac{v_c}{V_r} \frac{J_{Fe}}{J_{Nd}} \approx 0.09, \quad (4.10)$$

i.e., the ferrite cylinders allow an average ±9% tuning of each filter plate potential. For simplicity, the rectangular rods 50 have been depicted by their axes only. Also for simplicity, the filter plate of FIG. 26 is not shown in FIG. 27.

The thickness of the main ferromagnetic plates 20 must be chosen on the basis of the magnetic characteristics of the material in order to avoid the effects of saturation that would invalidate the basic assumption of equipotential plates. The flux of the induction within the main ferromagnetic plates generated by the main components of the magnet is essentially perpendicular to the plates. Consequently, a saturation of the material, if any, would occur only in close proximity of corners. The field distortion expected in the proximity of the corners can be illustrated in the two-dimensional problem of a square cross-section rod located in a uniform external field perpendicular to a face of the rod.

Figure 28:
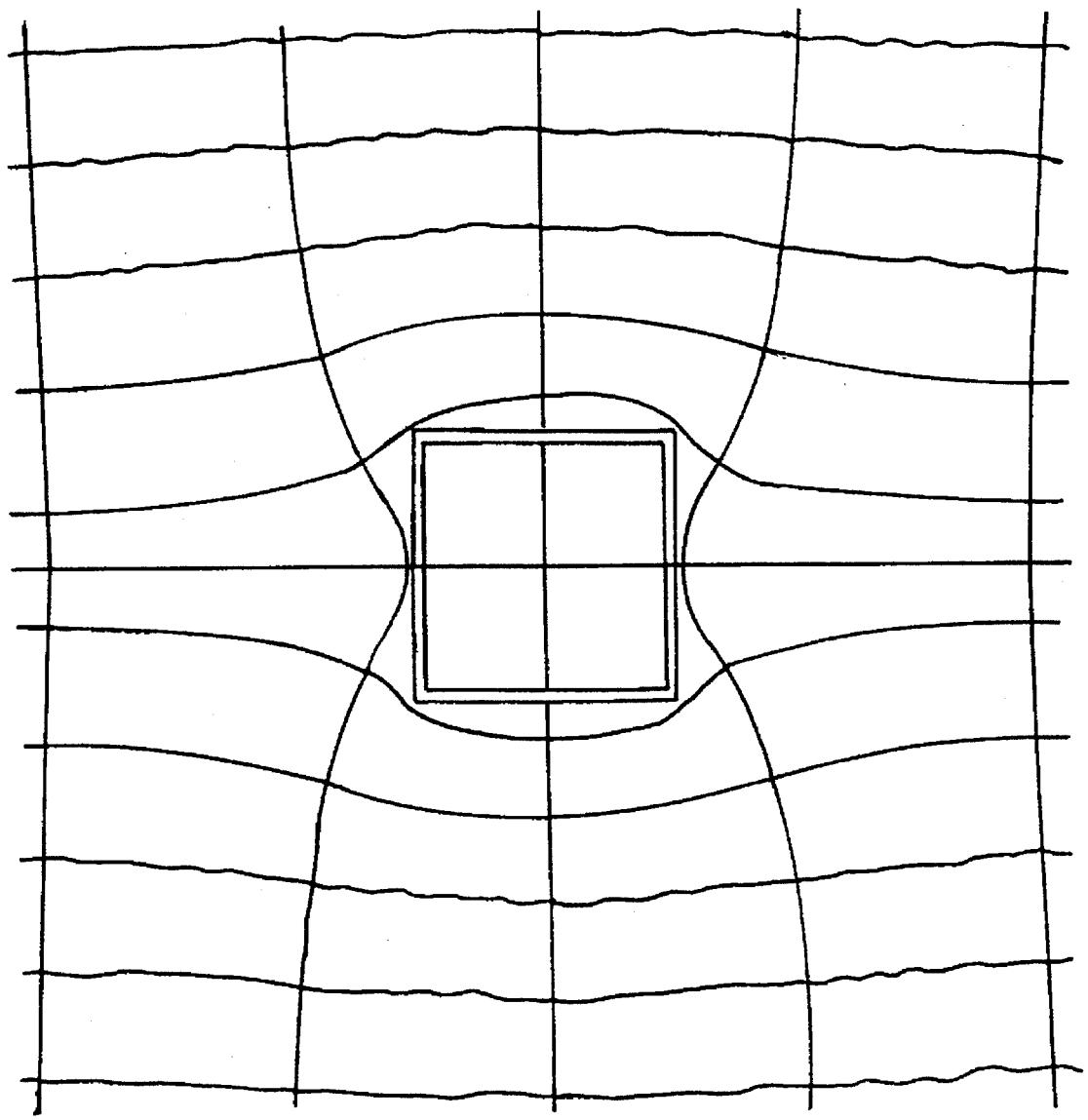
FIG. 28 illustrates the field configuration of a square cross section of a rod of high permeability material located in a uniform field perpendicular to a face of the rod.

The field configuration, shown in FIG. 28, is computed assuming a linear characteristic with a $\mu = 100 \, \mu_0$ magnetic permeability. See Technical Report TR-24 described above. The average value of the magnetic induction within the rod is about twice the induction of the external field, and, as a consequence, with a 0.2T external field any practical ferromagnetic material would operate below saturation. The induction generated by the magnetic material between the filter plates and main ferromagnetic plates is small compared to the remanence of the material. Hence, the thickness of the plates can be selected on the basis of mechanical requirements rather than magnetic considerations.

5. Summary

The computation of field distortion in a permanent magnet described above consists of a filter structure designed to eliminate each individual harmonic of the spatial spectrum of the field within the imaging region. The filter structure is developed around a thin, high permeability plate locate at the interface between the magnet cavity and the magnetic material. The plate performs the function of filtering out the spatial high frequency harmonics generated by the magnetization tolerances of the magnetic material.

The filtering of the dominant low frequency harmonics is obtained by a mathematical procedure that computes the potential distribution on the surface of the main ferromagnetic plate required to filter out each harmonic. The potential distribution is achieved by means of magnetic material inserted inside elements of the plate with a geometry determined by the spectrum of harmonics.

Compared to conventional shimming techniques, the accuracy of the harmonic elimination is based on the mechanical precision of the construction of the filter structure, rather than the tolerances of the magnetic material inserted between the plates. Moreover, the filter structure makes it possible to have a mechanical control of the potential distribution for the final shimming of the assembled magnet.

The filter structure described above can be implemented in all categories of permanent magnets including conventional magnets based on the use of the pole pieces designed to generate an assigned field. A pole piece is a rigid passive structure whose profile is determined by the field distribution, and its geometry cannot be easily altered for shimming purposes. The permanent magnetic material inserted between the filter plate and main plate makes it an active structure that provides the flexibility of adjustment of the field without modification of the geometry and distribution of the magnetic material.

Although the invention has been described with reference to preferred embodiments, it will be apparent to one skilled in the art that variations and modifications are contemplated within the spirit and scope of the invention. The drawings and description of the preferred embodiments are made by way of example rather than to limit the scope of the invention, and it is intended to cover within the spirit and scope of the invention all such changes and modifications.

We claim:

1. In an apparatus for nuclear magnetic resonance scanning and imaging (MRI) having a magnetic structure, said magnetic structure comprising:

first and second spaced apart ferromagnetic elements, said first and second ferromagnetic elements having surfaces which interface with and define a cavity and a first imaging region generally encompassed within said cavity and having an opening exposing said cavity to receive a body part;

means for producing a magnetic field within said cavity, said magnetic field having undesirable harmonics in said imaging region as a result of said opening; and means for reducing undesirable harmonics in said first region comprising means for controlling the magnetostatic potential of a surface of said first and second ferromagnetic elements interfacing with said cavity but outside said first region.

2. The apparatus of claim 1 wherein said first and second ferromagnetic elements are plates and said means for producing establishing at said surface of said plates equal and opposite potentials, respectively.

3. The apparatus of claim 2 wherein each ferromagnetic plate has an axis that is substantially transverse to the surface of each ferromagnetic plate and at the center thereof, the distance from said axis to and end of the ferromagnetic plate is substantially larger than the distance between said ferromagnetic plates so that said magnetic structure will generate only the lowest order of harmonics.

4. The apparatus of claim 2 wherein each ferromagnetic plate has an axis that is substantially transverse to the surface and at the center thereof, the distance from said axis of each plate to an end thereof is larger than the distance between said plates.

5. The apparatus of claim 4 wherein said means for controlling comprises a first and second plurality of additional ferromagnetic elements disposed adjacent said surface of said first and second ferromagnetic plates respectively and magnetically insulated therefrom, each ferromagnetic element of said first and second plurality of additional ferromagnetic elements having a predetermined magnetostatic potential different than said respective adjacent plate for eliminating the undesirable lower order harmonics.

6. The apparatus of claim 5 wherein said first and second plates have a plurality of recesses for receiving said first and second plurality of additional ferromagnetic elements, respectively.

7. The apparatus of claim 6 wherein said controlling means further comprises a predetermined mount of magnetized material inserted between each of said first and second plurality of additional ferromagnetic elements and said first and second ferromagnetic plates respectively to obtain said predetermined magnetostatic potentials on each of said first and second plurality of additional ferromagnetic elements.

8. The apparatus of claim 7 wherein said controlling means further comprises a predetermined number of permanent magnetic elements inserted between each of said plurality of first and second ferromagnetic elements and said ferromagnetic plates, respectively, to obtain said predetermined magnetostatic potentials on each of said additional plurality of ferromagnetic elements.

9. The apparatus of claim 8 wherein said permanent magnetic elements are rods, two of which are cylindrically shaped and are rotatable to generate a component of magnetization of each of said plurality of first and second ferromagnetic elements perpendicular to said first and second ferromagnetic plates respectively.

10. The apparatus of claim 7 wherein said first and second plurality of additional ferromagnetic elements are positioned in first and second planes that are aligned perpendicularly to said axis.

11. The apparatus of claim 10 wherein said surface outside said first region has a cylindrical shape, with said ferromagnetic plates serving as the flat sides of said cylinder, said cylinder having said axis perpendicular to said first and second plates.

12. The apparatus of claim 11 wherein each ferromagnetic element of said first and second plurality of additional ferromagnetic elements are equally spaced, adjacent one another and are arranged in the shape of first and second tings, respectively, said axis being coaxial with said surface of said first and second tings, said first and second rings having a radius larger than the radius of said cylinder.

13. The apparatus of claim 12 wherein said first and second rings are aligned in planes that are parallel.

14. The apparatus of claim 13 wherein each of said first and second plurality of magnetic elements are trapezoidally shaped.

15. The apparatus of claim 14 wherein said material between each ferromagnetic element and plate is inserted to control the orientation of magnetization of each ferromagnetic element relative to the respective plate.

16. The apparatus of claim 15 wherein said controlling means further comprises a third plurality of additional ferromagnetic element disposed between said first and second plurality of ferromagnetic elements, each of said third plurality of additional ferromagnetic elements having a predetermined magnetostatic potential relative to said magnetostatic potential of said first and second plurality of additional ferromagnetic elements for eliminating undesirable higher order harmonics.

17. The apparatus of claim 16 wherein said third plurality of additional ferromagnetic elements are positioned in the shape of a half ring, and are attached to but magnetically insulated from said magnetic structure, midway between said first and second rings, said half ring lies in a plane that is parallel to the planes of said first and second rings.

18. In an apparatus for nuclear magnetic resonance scanning and imaging (MRI) having a magnetic structure, said magnetic structure comprising:

a cavity disposed therein and an opening exposing said cavity to receive a body part;

first and second spaced apart ferromagnetic elements having surfaces which define a portion of said cavity;

means for producing a magnetic field within said cavity, said opening causing said field to distort;

means for compensating for said field distortion, said compensating means including a third ferromagnetic element disposed adjacent said first ferromagnetic element having at a surface interfacing with said cavity a magnetostatic potential different from said magnetostatic potential of said first ferromagnetic element.

19. The apparatus of claim 18 further comprising means for controlling the magnetostatic potential of the third ferromagnetic element.

20. The apparatus of claim 19 wherein said controlling means includes means for inserting magnetized material between said third ferromagnetic element and said first ferromagnetic element.

21. A method for compensating for field distortion in a magnetic structure for MRI including first and second ferromagnetic elements which interface with and define a portion of an open cavity disposed therein, comprising:

generating a magnetic field within said cavity, said open cavity resulting in field distortions in a first imaging region within the cavity;

computing the field on a surface of a second region which encompasses said first imaging region; and reducing the distortion within said first imaging region including the step of controlling the magnetostatic potential of the surfaces of the first and second ferromagnetic elements which interface with the cavity but which lie outside said first imaging region.

22. The method of claim 21 wherein said step of computing includes the step of calculating the potential as a function of the spatial harmonic series over a surface of said first region within said cavity.

23. The method of claim 22 wherein said step of controlling includes the step of successively eliminating orders of harmonics by inserting a predetermined amount of magnetized material between said first and second ferromagnetic elements and first and second plurality of additional ferromagnefic elements, respectively, spaced adjacent thereof to obtain predetermined potentials on each of said first and second plurality of additional ferromagnetic elements relative to said first and second ferromagnetic elements respectively.

24. The method of claim 23 wherein further comprising the step of performing a final tuning of said magnetic structure to accommodate tolerances of said magnet structure to obtain a substantially uniform field within said cavity by inserting or removing said magnetized material from between said first and second plurality of additional ferromagnetic elements and said first and second ferromagnetic elements, respectively.

* * * * *